US009578732B2

(12) United States Patent
Mitamura et al.

(10) Patent No.: US 9,578,732 B2
(45) Date of Patent: Feb. 21, 2017

(54) COMPOSITION FOR FORMING SILVER ION DIFFUSION-SUPPRESSING LAYER, FILM FOR SILVER ION DIFFUSION-SUPPRESSING LAYER, CIRCUIT BOARD, ELECTRONIC DEVICE, CONDUCTIVE FILM LAMINATE, AND TOUCH PANEL

(71) Applicant: FUJIFILM Corporation, Tokyo (JP)

(72) Inventors: Yasuhiro Mitamura, Kanagawa (JP); Masaya Nakayama, Kanagawa (JP); Yuki Matsunami, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 144 days.

(21) Appl. No.: 14/467,680

(22) Filed: Aug. 25, 2014

(65) Prior Publication Data
US 2015/0014030 A1 Jan. 15, 2015

Related U.S. Application Data

(63) Continuation of application No. PCT/JP2013/050665, filed on Jan. 16, 2013.

(30) Foreign Application Priority Data

Feb. 28, 2012 (JP) .................. 2012-042304
Mar. 21, 2012 (JP) .................. 2012-064114
Jul. 27, 2012 (JP) .................. 2012-167157

(51) Int. Cl.
*H05K 1/02* (2006.01)
*H05K 1/09* (2006.01)
*B32B 15/08* (2006.01)
*H05K 3/28* (2006.01)
*H01B 3/44* (2006.01)
*B32B 5/02* (2006.01)
*B32B 7/12* (2006.01)
*B32B 27/20* (2006.01)
*B32B 27/28* (2006.01)
*B32B 27/30* (2006.01)
*B32B 27/32* (2006.01)
*B32B 27/36* (2006.01)
*B32B 27/38* (2006.01)
*B32B 27/42* (2006.01)
*B32B 3/08* (2006.01)
*C08K 5/378* (2006.01)
*C08K 5/47* (2006.01)

(52) U.S. Cl.
CPC .............. *H05K 1/0256* (2013.01); *B32B 3/08* (2013.01); *B32B 5/024* (2013.01); *B32B 7/12* (2013.01); *B32B 15/08* (2013.01); *B32B 27/20* (2013.01); *B32B 27/281* (2013.01); *B32B 27/283* (2013.01); *B32B 27/30* (2013.01); *B32B 27/308* (2013.01); *B32B 27/32* (2013.01); *B32B 27/322* (2013.01); *B32B 27/36* (2013.01); *B32B 27/38* (2013.01); *B32B 27/42* (2013.01); *H01B 3/447* (2013.01); *H05K 1/092* (2013.01); *H05K 3/285* (2013.01); *B32B 2255/205* (2013.01); *B32B 2260/021* (2013.01); *B32B 2260/046* (2013.01); *B32B 2262/0269* (2013.01); *B32B 2262/101* (2013.01); *B32B 2307/202* (2013.01); *B32B 2307/412* (2013.01); *B32B 2457/00* (2013.01); *C08K 5/378* (2013.01); *C08K 5/47* (2013.01); *H05K 2201/0108* (2013.01); *H05K 2201/0145* (2013.01); *H05K 2201/0154* (2013.01); *H05K 2201/0206* (2013.01); *H05K 2201/032* (2013.01); *H05K 2201/0769* (2013.01); *Y10T 428/2804* (2015.01)

(58) Field of Classification Search
CPC ........ H05K 1/0256; H05K 1/092; H01B 3/447
See application file for complete search history.

(56) References Cited

U.S. PATENT DOCUMENTS 7,396,591 B2 7/2008 Miyashita et al.
7,741,388 B2 6/2010 Murotani et al.
(Continued)

FOREIGN PATENT DOCUMENTS

CN 1886025 A 12/2006
CN 101039984 A 9/2007
(Continued)

OTHER PUBLICATIONS

Office Action, issued by the Korean Intellectual Property Office on Jan. 29, 2016 in connection with corresponding Korean Patent Application No. 10-2014-7023635.
Notification of Reasons for Refusal issued by the Japanese Patent Office (JPO) on Feb. 10, 2015 in connection with Japanese Patent Application No. 2012-167157.
International Preliminary Report on Patentability issued by International Bureau of WIPO on Sep. 12, 2014 in connection with related Intl. Appln. No. PCT/JP2013/050665.
(Continued)

*Primary Examiner* — Robert Harlan
(74) *Attorney, Agent, or Firm* — Jean C. Edwards, Esq.; Edwards Neils LLC

(57) ABSTRACT

A composition for forming a silver ion diffusion-suppressing layer includes an insulating resin and a compound including: a structure selected from the group consisting of a triazole structure, a thiadiazole structure and a benzimidazole structure; a mercapto group; and at least one hydrocarbon group optionally containing a heteroatom, with the total number of carbon atoms in the hydrocarbon group or groups being 5 or more. The composition for forming a silver ion diffusion-suppressing layer allows formation of a silver ion diffusion-suppressing layer capable of suppressing silver ion migration between metal interconnects containing silver or a silver alloy to improve the reliability on the insulation between the metal interconnects.

24 Claims, 4 Drawing Sheets

(56) References Cited

U.S. PATENT DOCUMENTS

| 2012/0219792 | A1* | 8/2012 | Yamamoto | C03C 3/087 |
| | | | | 428/336 |
| 2012/0256878 | A1 | 10/2012 | Hashimoto et al. | |
| 2012/0298497 | A1 | 11/2012 | Maeda et al. | |

FOREIGN PATENT DOCUMENTS

| JP | 03-108279 A | | 5/1991 | |
| JP | 2006-143920 | | 6/2006 | |
| JP | 2006-143920 A | * | 6/2006 | ............. C08L 79/08 |
| JP | 2008-81560 A | | 4/2008 | |
| JP | 2008-192850 A | | 8/2008 | |
| JP | 2011-071367 A | | 4/2011 | |
| TW | 201111911 A1 | | 4/2011 | |
| TW | 201142679 A1 | | 12/2011 | |
| TW | 2012-05400 A1 | | 2/2012 | |

OTHER PUBLICATIONS

International Search Report issued in connection with International Patent Application No. PCT/JP2013/050665 on Mar. 12, 2013.
First Office Action issued by the State Intellectual Property Office (SIPO) of China on Oct. 8, 2015 in connection with Chinese Patent Application No. 201380011207.2.
Office Action issued by the Taiwanese Patent Office on Apr. 8, 2016 in connection with corresponding Taiwanese Patent Application No. 102102684.
Second Office Action issued by the State Intellectual Property Office on Jun. 7, 2016 in connection with corresponding Chinese Patent Application No. 201380011207.2.
Decision of Refusal issued by the Korean Patent Office on Aug. 8, 2016, in connection with Korean Patent Application No. 10-2014-7023635.

\* cited by examiner

COMPOSITION FOR FORMING SILVER ION DIFFUSION-SUPPRESSING LAYER, FILM FOR SILVER ION DIFFUSION-SUPPRESSING LAYER, CIRCUIT BOARD, ELECTRONIC DEVICE, CONDUCTIVE FILM LAMINATE, AND TOUCH PANEL

CROSS-REFERENCE TO RELATED APPLICATIONS

This application is a continuation of International Application No. PCT/JP2013/050665 filed on Jan. 16, 2013, which was published under PCT Article 21(2) in Japanese, which claims priority under 35 U.S.C. §119(a) to Japanese Patent Application No. 2012-042304 filed Feb. 28, 2012, Japanese Patent Application No. 2012-064114 filed Mar. 21, 2012, and Japanese Patent Application No. 2012-167157 filed Jul. 27, 2012. The above referenced applications are hereby expressly incorporated by reference, in their entirety, into the present application.

BACKGROUND OF THE INVENTION

The present invention relates to a composition for forming a silver ion diffusion-suppressing layer, a film for the silver ion diffusion-suppressing layer, a circuit board, an electronic device, a conductive film laminate, and a touch panel.

A circuit board having metal interconnects disposed on a surface of an insulating substrate has conventionally been used in a wide variety of electronic members and semiconductor devices. Silver and copper which have high electrical conductivity are often used as metals constituting metal interconnects but these metals have a problem in that ion migration is more likely to occur and this problem is particularly conspicuous in silver.

A method which involves introducing a metal ion adsorbing compound into a polymer layer is proposed as a method of preventing ion migration of such metals (JP 2008-192850 A).

SUMMARY OF THE INVENTION

On the other hand, in recent years, metal interconnects are getting miniaturized in association with downsizing of components such as semiconductor integrated circuits and chip components. Accordingly, the spacing between metal interconnects in a circuit board is getting narrower, which makes a short circuit due to ion migration more likely to occur. Under these circumstances, a still further improvement is required for the insulation reliability between silver- or silver alloy-containing metal interconnects in a circuit board.

The inventors of the present invention formed a polymer layer containing a compound such as a thiol-containing compound which may form an organometallic salt with a metal ion as disclosed in JP 2008-192850 A on top of metal interconnects containing silver or a silver alloy, and studied its insulation reliability. As a result, a significant reduction in interconnect resistance was seen between the metal interconnects and the effect of suppressing the ion migration did not meet the level presently required and further improvement was necessary.

The present invention has been made under these circumstances and an object of the prevent invention is to provide a composition for forming a silver ion diffusion-suppressing layer capable of forming the silver ion diffusion-suppressing layer which can suppress silver ion migration between metal interconnects containing silver or a silver alloy to improve the insulation reliability between the metal interconnects.

Another object of the present invention is to provide a film for a silver ion diffusion-suppressing layer which suppresses a short circuit due to silver ion migration between metal interconnects containing silver or a silver alloy to ensure more excellent insulation reliability between the metal interconnects, and a circuit board including the silver ion diffusion-suppressing layer.

Still another object of the present invention is to provide a conductive film laminate capable of suppressing silver ion migration between conductive films containing silver or a silver alloy to improve the insulation reliability between the conductive films.

The inventors of the present invention have made an intensive study on the prior art problems and as a result found that the dispersibility in the polymer layer of the metal ion adsorbing compound such as the thiol-containing compound as disclosed in JP 2008-192850 A affects the suppression of ion migration. More specifically, the metal ion adsorbing compound such as the thiol-containing compound as disclosed in JP 2008-192850 A is low in dispersibility due to its structure. Therefore, even if an attempt is made to introduce the metal ion adsorbing compound into the polymer layer (resin layer), it is difficult to uniformly disperse the compound in the polymer layer and the effect of suppressing migration of a metal ion (and in particular silver ion) cannot be obtained. Furthermore, if an attempt is made to introduce a large amount of the metal ion adsorbing compound into the polymer layer, the compound is deposited in the polymer layer to cause deterioration of the polymer and deterioration of electric reliability. In addition, such introduction may promote diffusion of metal ions to cause interconnect breakdown or other problem.

Based on the above findings, the inventors of the present invention have found that the above-described problems can be solved by forming a silver ion diffusion-suppressing layer using a composition containing a compound having a specific functional group.

Accordingly, the inventors of the present invention have found that the above-described problems can be solved by the characteristic features as described below.

(1) A composition for forming a silver ion diffusion-suppressing layer, comprising:
an insulating resin; and
a compound including: a structure selected from the group consisting of a triazole structure, a thiadiazole structure and a benzimidazole structure; a mercapto group; and at least one hydrocarbon group optionally containing a heteroatom, with a total number of carbon atoms in the at least one hydrocarbon group being 5 or more.

(2) The composition for forming a silver ion diffusion-suppressing layer according to (1), wherein the compound is a compound represented by one of formulae (1) to (3) to be described later.

(3) The composition for forming a silver ion diffusion-suppressing layer according to (1) or (2), wherein the at least one hydrocarbon group is a hydrocarbon group containing a tertiary carbon atom and/or a quaternary carbon atom.

(4) The composition for forming a silver ion diffusion-suppressing layer according to any one of (1) to (3), wherein the at least one hydrocarbon group is a hydrocarbon group which contains at least one type of group represented by one formula selected from the group consisting of formulae (B-1) to (B-7) to be described later and which is optionally bonded directly to the structure selected from the group consisting of the triazole structure, the thiadiazole structure and the benzimidazole structure at one of asterisks in formulae (B-1) to (B-7) to be described later.

(5) The composition for forming a silver ion diffusion-suppressing layer according to any one of (1) to (4), wherein the at least one hydrocarbon group is a group represented by —S—$R_q$ [where $R_q$ represents a hydrocarbon group containing 1 to 30 carbon atoms which may have —COO— or —CON<].

(6) A film for a silver ion diffusion-suppressing layer, comprising:

an insulating resin; and a compound including: a structure selected from the group consisting of a triazole structure, a thiadiazole structure and a benzimidazole structure; a mercapto group; and at least one hydrocarbon group optionally containing a heteroatom, with a total number of carbon atoms in the at least one hydrocarbon group being 5 or more.

(7) The film for a silver ion diffusion-suppressing layer according to (6), wherein the compound is a compound represented by one of formulae (1) to (3) to be described later.

(8) The film for a silver ion diffusion-suppressing layer according to (6) or (7), wherein the at least one hydrocarbon group is a hydrocarbon group containing a tertiary carbon atom and/or a quaternary carbon atom.

(9) The film for a silver ion diffusion-suppressing layer according to any one of (6) to (8), wherein the at least one hydrocarbon group is a hydrocarbon group which contains at least one type of group represented by one formula selected from the group consisting of formulae (B-1) to (B-7) to be described later and which is optionally bonded directly to the structure selected from the group consisting of the triazole structure, the thiadiazole structure and the benzimidazole structure at one of asterisks in formulae (B-1) to (B-7) to be described later.

(10) The film for a silver ion diffusion-suppressing layer according to any one of (6) to (9), wherein the at least one hydrocarbon group is a group represented by —S—$R_q$ [where $R_q$ represents a hydrocarbon group containing 1 to 30 carbon atoms which may have —COO— or —CON<].

(11) A circuit board comprising: an insulating substrate; metal interconnects disposed on the insulating substrate and containing silver or a silver alloy; and a silver ion diffusion-suppressing layer disposed on the metal interconnects, wherein the silver ion diffusion-suppressing layer comprises an insulating resin and a compound including: a structure selected from the group consisting of a triazole structure, a thiadiazole structure and a benzimidazole structure; a mercapto group; and at least one hydrocarbon group bonded to the structure and optionally containing a heteroatom, with a total number of carbon atoms in the at least one hydrocarbon group being 5 or more.

(12) The circuit board according to (11), wherein the compound is a compound represented by one of formulae (1) to (3) to be described later.

(13) The circuit board according to (11) or (12), wherein the at least one hydrocarbon group is a hydrocarbon group containing a tertiary carbon atom and/or a quaternary carbon atom.

(14) The circuit board according to any one of (11) to (13), wherein the at least one hydrocarbon group is a hydrocarbon group which contains at least one type of group represented by one formula selected from the group consisting of formulae (B-1) to (B-7) to be described later and which is optionally bonded directly to the structure selected from the group consisting of the triazole structure, the thiadiazole structure and the benzimidazole structure at one of asterisks in formulae (B-1) to (B-7) to be described later.

(15) The circuit board according to any one of (11) to (14), wherein the at least one hydrocarbon group is a group represented by —S—$R_q$ [where $R_q$ represents a hydrocarbon group containing 1 to 30 carbon atoms which may have —COO— or —CON<].

(16) An electronic device comprising: the circuit board according to any one of (11) to (15).

(17) A conductive film laminate comprising: a transparent substrate; a conductive film disposed on the transparent substrate and containing silver or a silver alloy; and a transparent double-sided adhesive sheet attached onto the conductive film, wherein the transparent double-sided adhesive sheet comprises a compound including: a structure selected from the group consisting of a triazole structure, a thiadiazole structure and a benzimidazole structure; a mercapto group; and at least one hydrocarbon group optionally containing a heteroatom, with a total number of carbon atoms in the at least one hydrocarbon group being 5 or more.

(18) The conductive film laminate according to (17), wherein the compound is a compound represented by one of formulae (1) to (3) to be described later.

(19) The conductive film laminate according to (17) or (18), wherein the at least one hydrocarbon group is a hydrocarbon group containing a tertiary carbon atom and/or a quaternary carbon atom.

(20) The conductive film laminate according to any one of (17) to (19), wherein the at least one hydrocarbon group is a hydrocarbon group which contains at least one type of group represented by one formula selected from the group consisting of formulae (B-1) to (B-7) to be described later and which is optionally bonded directly to the structure selected from the group consisting of the triazole structure, the thiadiazole structure and the benzimidazole structure at one of asterisks in formulae (B-1) to (B-7) to be described later.

(21) The conductive film laminate according to any one of (17) to (20), wherein the at least one hydrocarbon group is a group represented by —S—$R_q$ [where $R_q$ represents a hydrocarbon group containing 1 to 30 carbon atoms which may have —COO— or —CON<].

(22) The conductive film laminate according to any one of (17) to (21), wherein the conductive film includes metal nanowires composed of silver or a silver alloy.

(23) The conductive film laminate according to any one of (17) to (22), wherein the transparent double-sided adhesive sheet contains an acrylic adhesive.

(24) A touch panel comprising: the conductive film laminate according to any one of (17) to (23).

The present invention can provide a composition for forming a silver ion diffusion-suppressing layer capable of forming the silver ion diffusion-suppressing layer which can suppress silver ion migration between metal interconnects containing silver or a silver alloy to improve the insulation reliability between the metal interconnects.

The present invention can also provide a film for a silver ion diffusion-suppressing layer which suppresses silver ion migration between metal interconnects containing silver or a silver alloy to ensure more excellent insulation reliability between the metal interconnects, and a circuit board including the silver ion diffusion-suppressing layer.

The present invention can further provide a conductive film laminate capable of suppressing silver ion migration between conductive films containing silver or a silver alloy to improve the insulation reliability between the conductive films.

DETAILED DESCRIPTION OF THE INVENTION

Figure 1:
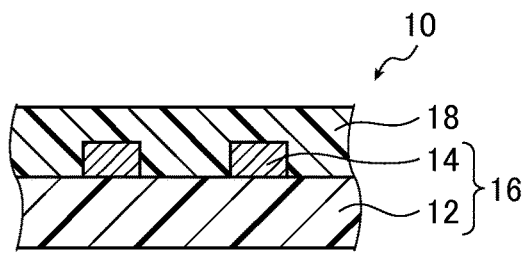
FIG. 1 is a schematic cross-sectional view of a preferred embodiment of a circuit board of the invention.

The composition for forming a silver ion diffusion-suppressing layer, the film for the silver ion diffusion-suppressing layer, the circuit board and the conductive film laminate according to the invention are described below with reference to preferred embodiments.

The characteristic features of the invention compared to the prior art are first described in detail.

As described above, it is found in the present invention that desired effects are obtained by controlling the compatibility between a compound that may form an organometallic salt with silver ion and an insulating resin in which the compound is dispersed. More specifically, introduction of a specific functional group into the compound results in improvement of the dispersibility of the compound in the insulating resin and improvement of the effect of suppressing ion migration between silver interconnects without causing deterioration of the insulating resin.

The composition for forming a silver ion diffusion-suppressing layer is first described in detail and the film for the silver ion diffusion-suppressing layer and the circuit board are then described in detail. The conductive film laminate will be described later in detail.

<Composition for Forming Silver Ion Diffusion-Suppressing Layer>

The composition for forming a silver ion diffusion-suppressing layer (composition for forming a migration-suppressing layer; hereinafter also referred to simply as "composition") is a composition for forming a silver ion diffusion-suppressing layer (migration-suppressing layer) suppressing silver ion migration on metal interconnects containing silver or a silver alloy (hereinafter also referred to simply as "metal interconnects").

Ingredients contained in the composition are described below in detail.

(Insulating Resin)

The composition contains an insulating resin. The insulating resin covering the metal interconnects and disposed between the metal interconnects ensures the insulation between the metal interconnects.

The insulating resin used may be a known insulating resin and curable insulating resins (e.g., a thermosetting insulating resin and a photo-curable insulating resin) are preferably used in terms of easier formation of the silver ion diffusion-suppressing layer.

Examples of the thermosetting insulating resin include epoxy resin, bismaleimide-triazine resin, polyimide resin, acrylic resin, phenol resin, melamine resin, silicone resin, unsaturated polyester resin, cyanate ester resin and isocyanate resin, and modified resins thereof.

Examples of the photo-curable insulating resin include unsaturated polyester resin, polyester acrylate resin, urethane acrylate resin, silicone acrylate resin and epoxy acrylate resin, and modified resins thereof.

Other exemplary insulating resins include thermoplastic resins such as polyethylene (PE), polypropylene (PP), ethylene-vinyl acetate copolymer (EVA), ethylene-ethyl acrylate copolymer (EEA), polylactic acid, fluorine-containing resin, polyether sulfone resin, polyphenylene sulfide resin and polyether ether ketone resin.

Of these, epoxy resin and acrylic resin are preferable in terms of more excellent compatibility with the compound to be described later.

When necessary, the insulating resin to be used may be impregnated into a core material such as glass woven fabric, glass non-woven fabric and aramid non-woven fabric. To be more specific, glass fabric/epoxy resin, glass fabric/bismaleimide-triazine resin, glass fabric/polyphenylene ether resin, aramid non-woven fabric/epoxy resin, and aramid non-woven fabric/polyimide resin may be used.

When the insulating resin is a curable resin, additives such as a curing agent and a curing accelerator may optionally be used in combination.

The insulating resin used may be a mixture of two or more insulating resins.

The content of the insulating resin in the composition is not particularly limited and an optimal amount is appropriately selected. For instance, when the composition contains a solvent, the content of the insulating resin is preferably 15 to 80 wt % and more preferably 20 to 75 wt % with respect to the total amount of the composition in terms of easier handling and easy control of the thickness of the silver ion diffusion-suppressing layer.

(Compound)

The composition contains a compound having a structure selected from the group consisting of a triazole structure, a thiadiazole structure and a benzimidazole structure; a mercapto group; and a specific functional group (this compound being hereinafter also referred to as "SH group-containing compound"). The SH group-containing compound mainly serves to suppress corrosion of the metal interconnects through contact with the metal interconnects via the SH group and to suppress occurrence of silver ion migration through dispersion into the silver ion dispersion-suppressing layer.

The SH group-containing compound contains a structure selected from the group consisting of a triazole structure, a thiadiazole structure and a benzimidazole structure. In particular, a triazole structure and a thiadiazole structure are preferable in terms of more excellent ability to suppress ion migration.

In general, mercapto group is known to be rich in reactivity for forming a covalent bond with silver. A compound X which does not contain the above-described triazole structure, thiadiazole structure and benzimidazole structure but contains an SH group can form a salt with silver ion via the SH group in the same manner as the SH group-containing compound. However, if the salt formed between the compound X and the silver ion is in the composition which is in direct contact with the metal interconnects containing silver or a silver alloy, the salt may dissolve the interconnects or have an enormous influence on the metal interconnects. On the other hand, the SH group-containing compound having the above-specified structure suppresses such influence on the metal interconnects and is also excellent in the effect of suppressing the silver ion migration.

As illustrated more specifically below, the structures can be represented by the following formulae (X) to (Z), respectively.

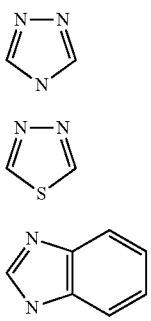

Formula (X)

Formula (Y)

Formula (Z)

The SH group-containing compound contains a mercapto group (HS—). Mercapto group is rich in reactivity for forming a covalent bond with silver. The mercapto group is bonded to a structure such as the foregoing triazole structure.

The amount of mercapto groups in the SH group-containing compound is not particularly limited and the ratio of the total atomic weight of the mercapto groups to the total molecular weight of the compound is preferably up to 50% and most preferably up to 40% from the viewpoint that the dispersibility of the compound in the insulating resin is better.

The number of mercapto groups may not be one but more than one.

The SH group-containing compound has at least one hydrocarbon group optionally containing a heteroatom (hereinafter also referred to simply as "hydrocarbon group") and the total number of carbon atoms in the hydrocarbon group (if a plurality of hydrocarbon groups are included in the compound, the total number refers to the sum of the numbers of carbon atoms in the respective hydrocarbon groups) is 5 or more. By incorporating the hydrocarbon group(s) in the compound, the compatibility with the insulating resin is further increased and the effect of suppressing silver ion migration is also further enhanced.

A hydrocarbon group is a group containing carbon and hydrogen. The hydrocarbon group is usually bonded to a structure such as the foregoing triazole structure. To be more specific, exemplary hydrocarbon groups include an aliphatic hydrocarbon group, an aromatic hydrocarbon group, and a combination group thereof.

The number of carbon atoms in the respective hydrocarbon groups is not particularly limited as long as the total number of carbon atoms to be mentioned later is 5 or more.

The number of carbon atoms is preferably 4 or more, more preferably 6 or more, and most preferably 8 or more in terms of more excellent ability to suppress silver ion migration. Although the upper limit is not particularly limited, the number of carbon atoms is preferably up to 62 and more preferably up to 30 and even more preferably up to 24 in terms of more excellent ability to suppress silver ion migration.

The aliphatic hydrocarbon group preferably contains 4 or more carbon atoms and more preferably 6 or more carbon atoms. Although the upper limit is not particularly limited, the number of carbon atoms is preferably up to 40 in terms of more excellent ability to suppress silver ion migration. The aliphatic hydrocarbon group may be linear, branched or cyclic, and is preferably a linear group in which the aliphatic hydrocarbon moiety contains up to 18 carbon atoms or a branched group containing a tertiary or quaternary carbon atom in terms of more excellent dispersibility of the compound in the insulating resin.

The aromatic hydrocarbon group preferably contains 6 or more carbon atoms and is more preferably an aromatic hydrocarbon group having 2 or more substituents.

The total number of carbon atoms in all hydrocarbon groups bonded to any of the foregoing structures is 5 or more. If the total number of carbon atoms is within the above range, silver ion migration is suppressed to improve the insulation reliability between the metal interconnects. The total number is preferably 6 or more and more preferably 8 or more because the foregoing effects are more excellent. Although the upper limit is not particularly limited, the total number is preferably up to 36 and more preferably up to 24 because the synthesis is easier and the dispersibility in the insulating resin is more excellent.

If the compound contains one hydrocarbon group, the number of carbon atoms in the hydrocarbon group should be 5 or more.

If the compound contains more than one hydrocarbon groups, the total number of carbon atoms contained in the respective hydrocarbon groups should be 5 or more. More specifically, if two hydrocarbon groups (hydrocarbon group A and hydrocarbon group B) are contained in the compound, the sum of the number of carbon atoms in the hydrocarbon group A and the number of carbon atoms in the hydrocarbon group B should be 5 or more.

The above-described total number of carbon atoms can also be represented by formula (A) below.

In other words, the total number of carbon atoms $T_c$ in the compound as represented by formula (A) should be 5 or more.

$$Tc = \sum_{i=1}^{m} Ci$$

Formula (A)

In formula (A), Ci represents the number of carbon atoms in the ith hydrocarbon group contained in the compound, and i represents an integer from 1 to m.

The hydrocarbon group may contain a heteroatom. That is, the hydrocarbon group may be a heteroatom-containing hydrocarbon group. The kind of the heteroatom contained is not particularly limited and examples thereof include halogen atoms, oxygen atom, nitrogen atom, sulfur atom, selenium atom and tellurium atom. It is particularly preferred in terms of excellent ability to suppress silver ion migration that heteroatoms are contained in the form of such a group as —X$_1$—, —N(R$_a$)—, —C(=X$_2$)—, —CON(R$_b$)—, —C(=X$_3$)X$_4$—, —SO$_n$—, —SO$_2$N(R$_c$)—, a halogen atom, or a combination thereof.

X$_1$ to X$_4$ are each independently selected from the group consisting of oxygen atom, sulfur atom, selenium atom and tellurium atom. In particular, oxygen atom and sulfur atom are preferable in terms of easier handling.

R$_a$, R$_b$ and R$_c$ are each independently selected from among hydrogen atom and hydrocarbon groups containing 1 to 20 carbon atoms.

The subscript n represents an integer from 1 to 3.

In cases where a heteroatom is contained in the hydrocarbon group, the heteroatom may be present in the chain or at the end (terminal) of the hydrocarbon group. In cases where a heteroatom is present at the end of the hydrocarbon group, the hydrocarbon group may be bonded to the above-described triazole structure or the like through direct bonding thereto via the heteroatom. In other words, the heteroatom may be located in the hydrocarbon group at a position of binding to a structure such as the triazole structure.

Specific examples of the hydrocarbon group in which the heteroatom is located at the binding position include —O—R$_p$, —S—R$_q$ and —SO$_n$—R$_r$. In particular, —S—R$_q$ is preferable because the ability to suppress silver ion migration is excellent in a more consistent manner.

R$_p$, R$_q$ and R$_r$ are each independently a hydrocarbon group containing 1 to 30 carbon atoms which may have —COO— or —CON<. In particular, R$_p$, R$_q$ and R$_r$ are each preferably a hydrocarbon group containing 5 to 20 carbon atoms which may have —COO— or —CON<.

In cases where a heteroatom is contained in the hydrocarbon group, the heteroatom may be contained in the form of mercapto group (—SH).

A suitable example of the hydrocarbon group is a hydrocarbon group containing a tertiary carbon atom and/or a quaternary carbon atom.

In cases where the hydrocarbon group contains a tertiary carbon atom and/or a quaternary carbon atom, the dispersibility of the SH group-containing compound in the insulating resin is more excellent and/or the solubility in solvents to be described later (e.g., ethyl acetate, toluene and methyl ethyl ketone) is more excellent. As a result, the ability to suppress silver ion migration is exhibited more uniformly, and fine crystals and air bubbles derived from the fine crystals that may induce silver ion migration are less likely to occur.

When the hydrocarbon group is one containing a tertiary carbon atom and/or a quaternary carbon atom, it is preferable for the tertiary carbon atom and/or the quaternary carbon atom to be an asymmetric carbon atom and for the SH group-containing compound to be an enantiomeric mixture.

The hydrocarbon group is preferably one containing a plurality of tertiary carbon atoms and/or a plurality of quaternary carbon atoms. When the hydrocarbon group contains a plurality of tertiary carbon atoms and/or a plurality of quaternary carbon atoms, it is preferable for the tertiary carbon atoms and/or the quaternary carbon atoms to be asymmetric carbon atoms and for the SH group-containing compound to be a diastereomeric mixture for the reason that the dispersibility of the SH group-containing compound is more excellent.

The hydrocarbon group containing one or more tertiary carbon atoms and/or one or more quaternary carbon atoms preferably contains 5 to 30 carbon atoms and more preferably 6 to 20 carbon atoms. When the number of carbon atoms is within the foregoing range, the SH group-containing compound has more excellent dispersibility and as a result the ability to suppress silver ion migration is more uniformly exhibited. When the number of carbon atoms is within the foregoing range, the ability to suppress silver ion migration is more excellent in terms of the amount of mercapto groups in the SH group-containing compound.

Specific examples of the hydrocarbon group containing one or more tertiary carbon atoms and/or one or more quaternary carbon atoms include an aliphatic hydrocarbon group, an aromatic hydrocarbon group, and a hydrocarbon group as a combination thereof, each containing one or more tertiary carbon atoms and/or one or more quaternary carbon atoms.

Specific examples of the hydrocarbon group (preferably containing one or more tertiary carbon atoms and/or one or more quaternary carbon atoms) include those containing groups illustrated below. Each dot represents a binding position.

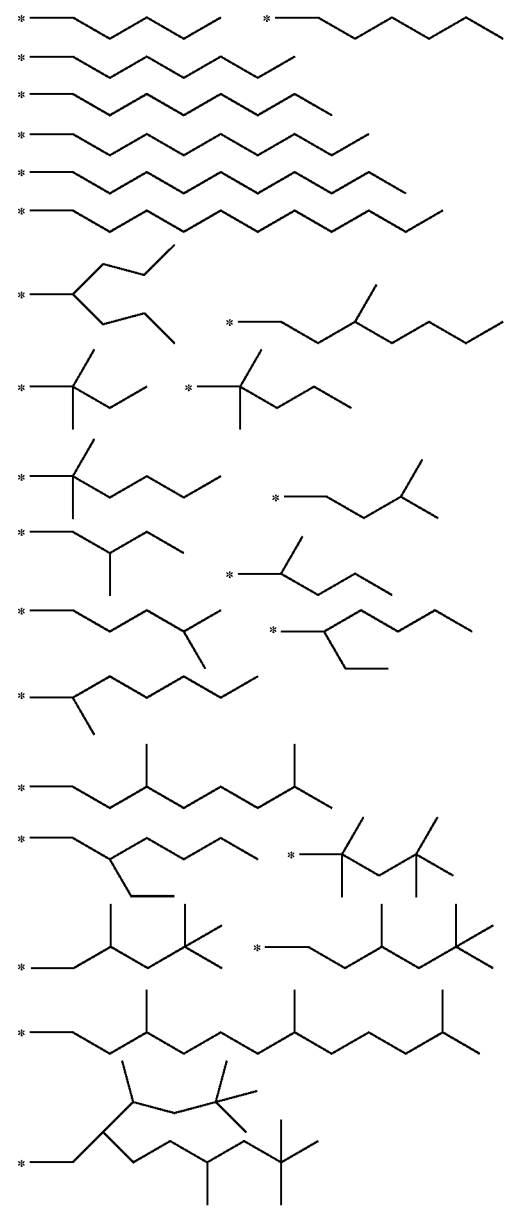

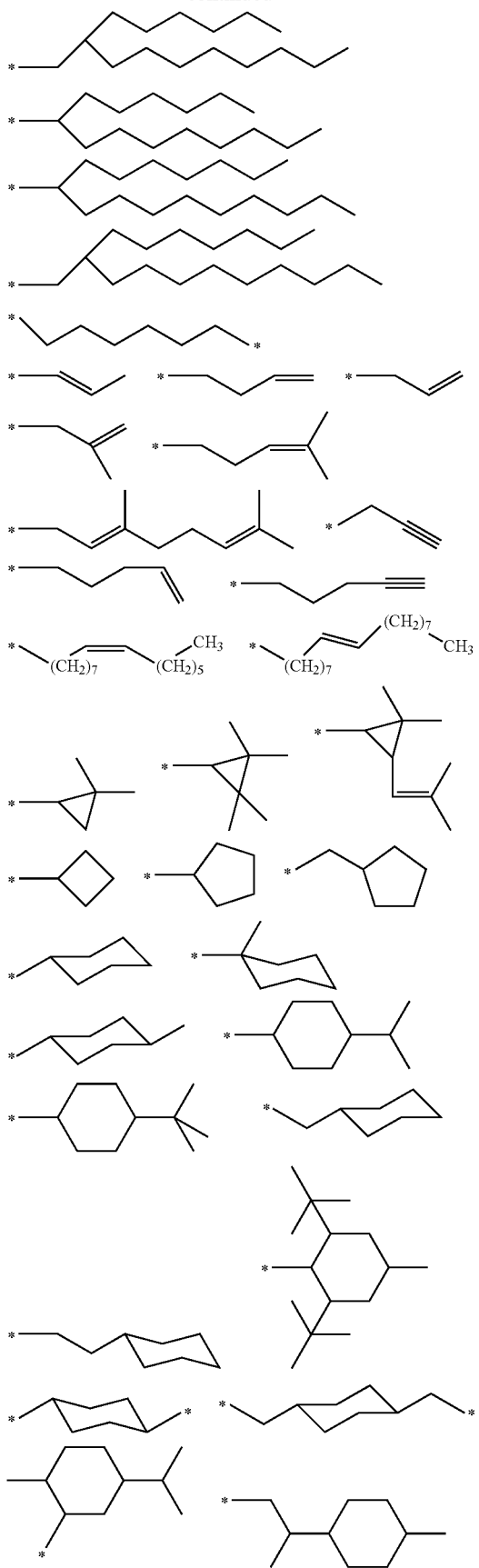
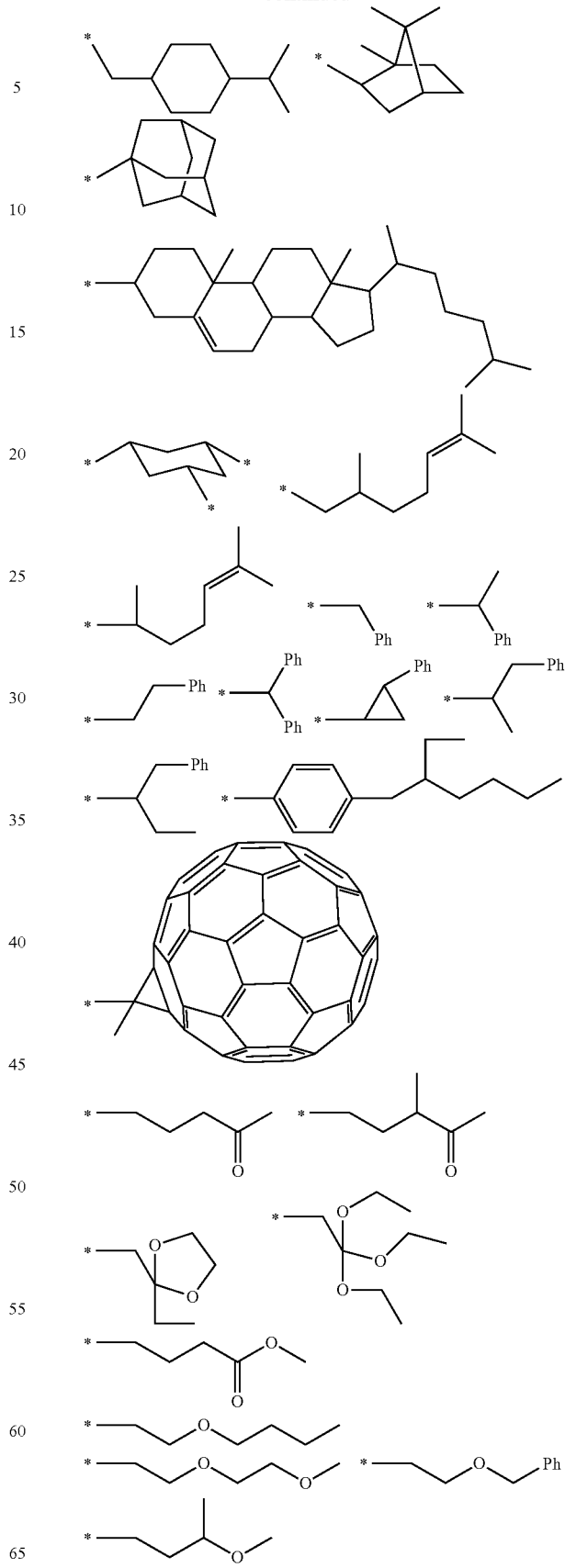

Other preferable embodiments of the hydrocarbon group include hydrocarbon groups containing at least one type of group represented by one formula selected from the group consisting of formulae (B-1) to (B-7) shown below.

When the hydrocarbon group contains at least one type of group represented by one formula selected from the group consisting of formulae (B-1) to (B-7) shown below, as in the above-described case where the hydrocarbon group contains one or more tertiary carbon atoms and/or one or more quaternary carbon atoms, the dispersibility of the SR group-containing compound in the insulating resin is more excellent and/or the solubility in solvents to be described later (e.g., ethyl acetate, toluene and methyl ethyl ketone) is more excellent. As a result, the ability to suppress silver ion migration is exhibited more uniformly, and fine crystals and air bubbles derived from the fine crystals that may induce silver ion migration are less likely to occur. The hydrocarbon group may contain two or more types of groups selected from the group consisting of formulae (B-1) to (B-7) shown below.

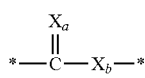

Formula (B-1)

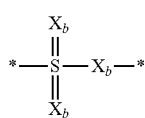

Formula (B-2)

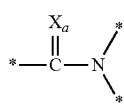

Formula (B-3)

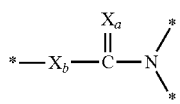

Formula (B-4)

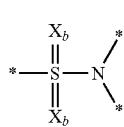

Formula (B-5)

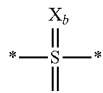

Formula (B-6)

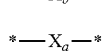

Formula (B-7)

In formulae (B-1) to (B-7), groups $X_a$ are each an atom selected from the group consisting of oxygen atom, sulfur atom, selenium atom and tellurium atom. In particular, oxygen atom and sulfur atom are preferable in terms of easier handling. The groups $X_a$ may be identical to or different from each other. Groups $X_b$ are each an oxygen atom or a sulfur atom. The groups $X_b$ may be identical to or different from each other. Each asterisk (*) represents a binding position.

An aliphatic hydrocarbon group containing 1 to 30 carbon atoms or an aromatic hydrocarbon group containing 6 to 30 carbon atoms may be bonded to the asterisks.

The hydrocarbon group containing at least one type of group represented by one formula selected from the group consisting of formulae (B-1) to (B-7) shown above may be a hydrocarbon group which is directly bonded to a structure selected from the group consisting of an triazole structure, a thiadiazole structure and a benzimidazole structure at one of the asterisks in formulae (B-1) to (B-7) shown above.

Specific examples of the embodiment in which the hydrocarbon group contains a group represented by formula (B-1) or (B-2) include embodiments with the hydrocarbon group containing the groups illustrated below. Each dot represents a binding position.

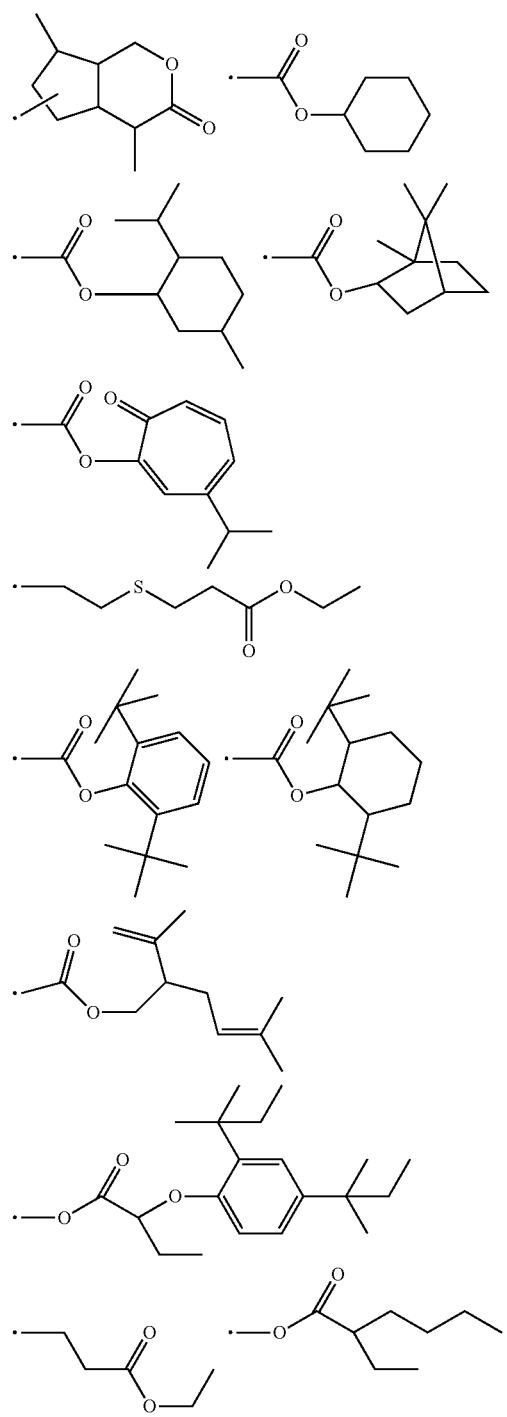

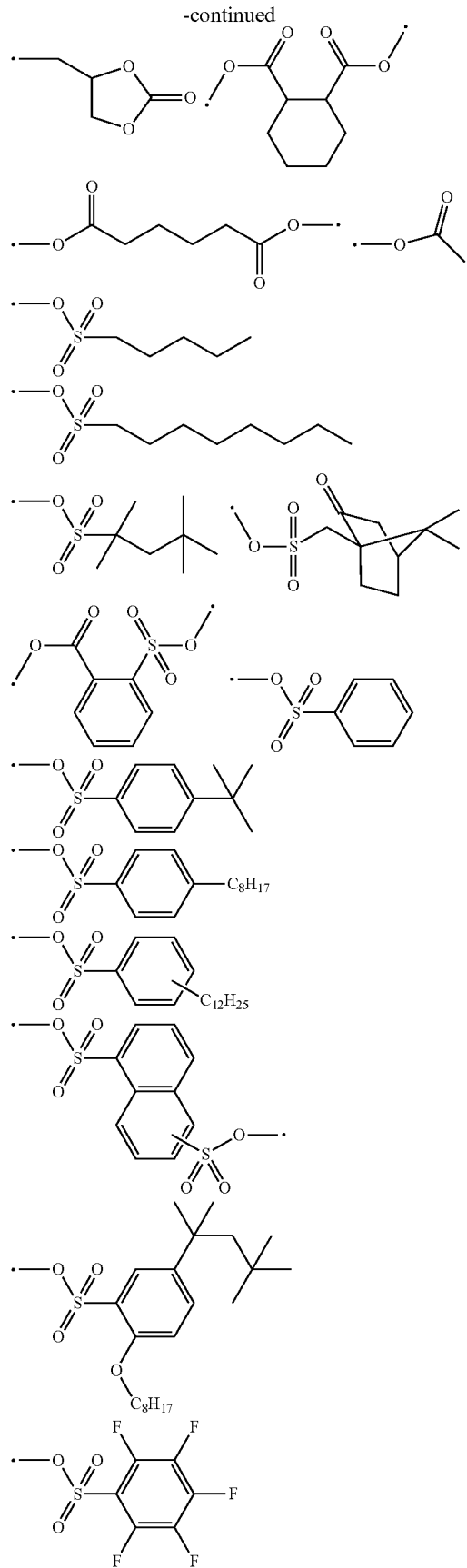
Specific examples of the embodiment in which the hydrocarbon group contains one or some of groups represented by formulae (B-3) to (B-7) include embodiments containing the groups illustrated below. Each dot represents a binding position.
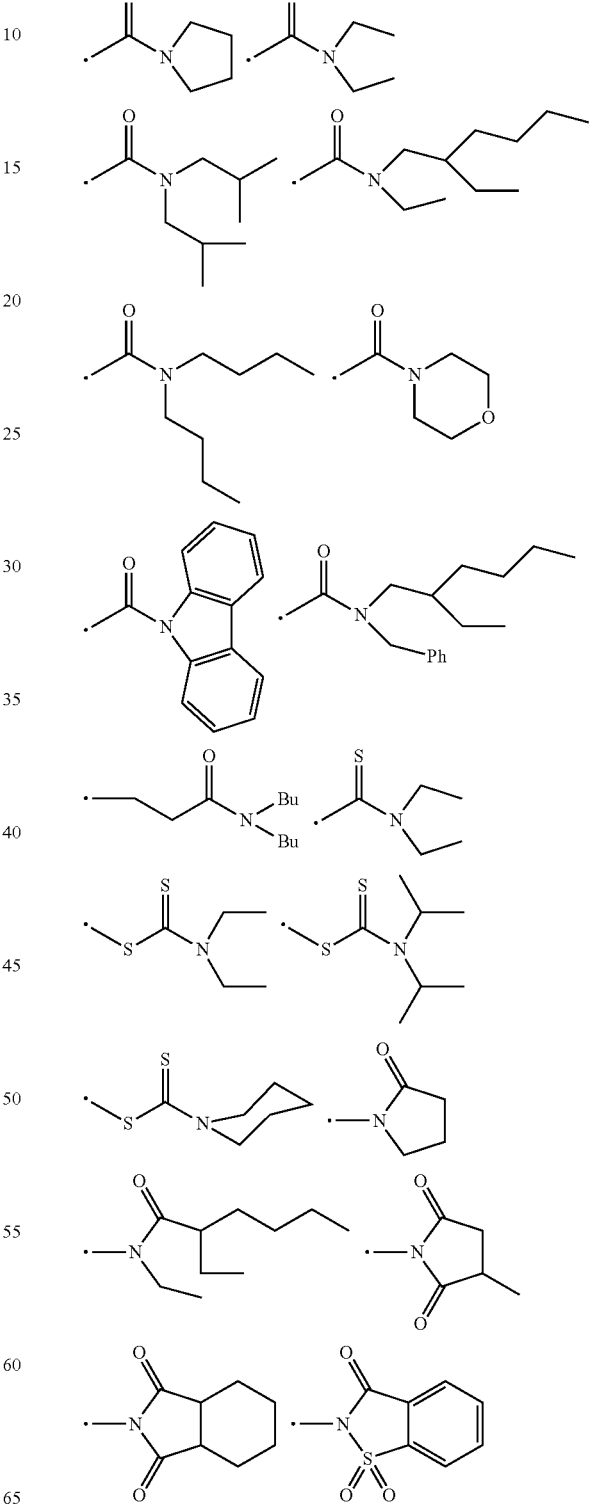

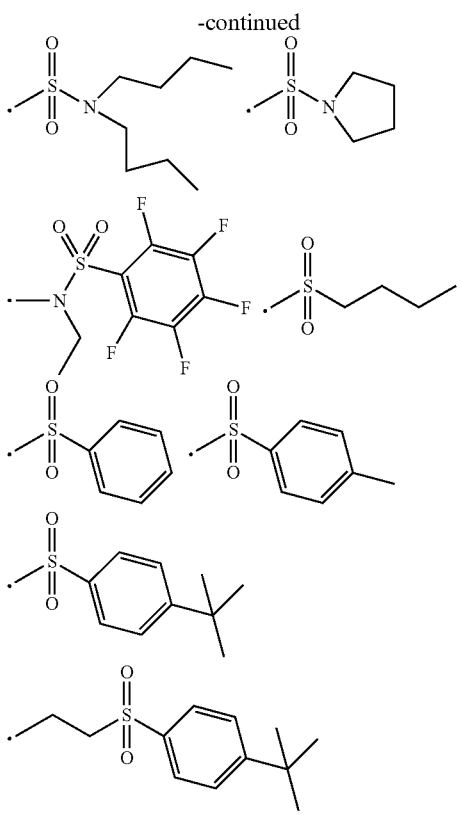

The molecular weight of the SH group-containing compound is not particularly limited and is preferably from 50 to 1,000 and more preferably from 100 to 600 in terms of more excellent compatibility with the insulating resin.

(Preferred Embodiments)

Preferred embodiments of the SH group-containing compound include compounds represented by formulae (1) to (3) shown below. Such compounds have more excellent ability to suppress ion migration. The compounds represented by formula (1) or formula (2) are particularly preferable because the effects of the invention are more excellent.

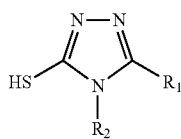

Formula (1)

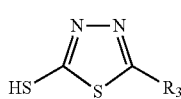

Formula (2)

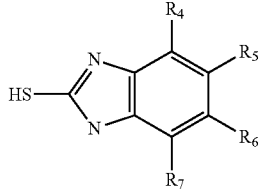

Formula (3)

In formula (1), $R_1$ and $R_2$ each independently represent a hydrogen atom or a hydrocarbon group optionally containing a heteroatom, at least one of $R_1$ and $R_2$ represents a hydrocarbon group optionally containing a heteroatom, and the total number of carbon atoms contained in the groups $R_1$ and $R_2$ is 5 or more.

A preferred embodiment of $R_1$ and $R_2$ is a hydrocarbon group (e.g., an aliphatic hydrocarbon group, an aromatic hydrocarbon group or a combination thereof) optionally containing —$X_1$—, —N($R_a$)—, —C(=$X_2$)—, —CON($R_b$)—, —C(=$X_3$)$X_4$—, —SO$_n$—, —SO$_2$N($R_c$)— or a halogen atom. $X_1$ to $X_4$, $R_a$ to $R_c$ and n are as defined above. In particular, an aryl group or a hydrocarbon group which may contain —$X_1$—, —N($R_a$)—, —C(=$X_2$)—, —CON($R_b$)— or —C(=$X_3$)$X_4$— is preferable and at least one of $R_1$ and $R_2$ is more preferably an aliphatic hydrocarbon group from the viewpoint that the SH group-containing compound has more excellent ability to suppress migration.

Preferred embodiments of the hydrocarbon groups (the aliphatic hydrocarbon group and the aromatic hydrocarbon group) are as described above and the kind of the heteroatom is also as described above.

Another preferred embodiment of $R_1$ and $R_2$ is a hydrocarbon group containing one or more tertiary carbon atoms and/or one or more quaternary carbon atoms. Specific examples of the hydrocarbon group containing one or more tertiary carbon atoms and/or one or more quaternary carbon atoms are as described above.

Still another preferable embodiment of $R_1$ and $R_2$ is a hydrocarbon group containing at least one type of group represented by one formula selected from the group consisting of formulae (B-1) to (B-7) shown above. Specific examples of the hydrocarbon group containing the at least one type of group are as described above.

In formula (1), the sum of the numbers of carbon atoms contained in the groups $R_1$ and $R_2$ is 5 or more. In other words, the total number (total number of carbon atoms) obtained by summing the number of carbon atoms in $R_1$ and the number of carbon atoms in $R_2$ should be 5 or more. The total number in a preferred embodiment is as described above.

In formula (2), $R_3$ represents a hydrocarbon group optionally containing a heteroatom and the number of carbon atoms contained in $R_3$ is 5 or more.

The hydrocarbon group is as defined above. In formula (2), a preferred embodiment of the hydrocarbon group is a hydrocarbon group (e.g., an aliphatic hydrocarbon group, an aromatic hydrocarbon group or a combination thereof) optionally containing —$X_1$—, —N($R_a$)—, —C(=$X_2$)—, —CON($R_b$)—, —C(=$X_3$)$X_4$—, —SO$_n$—, —SO$_2$N($R_c$)— or a halogen atom. Of these, a hydrocarbon group (in particular an aliphatic hydrocarbon group) containing —$X_1$— or —N($R_a$)— is preferable because the effect of suppressing ion migration is further improved. In addition, the hydrocarbon group is more preferably —$X_1$—$R_q$ and even more preferably —S—$R_q$ because the effect of suppressing ion migration is further improved.

Another preferred embodiment of the hydrocarbon group is a hydrocarbon group containing one or more tertiary carbon atoms and/or one or more quaternary carbon atoms. Specific examples of the hydrocarbon group containing one or more tertiary carbon atoms and/or one or more quaternary carbon atoms are as described above.

Still another preferable embodiment of the hydrocarbon group is a hydrocarbon group containing at least one type of group represented by one formula selected from the group consisting of formulae (B-1) to (B-7) shown above. Specific examples of the hydrocarbon group containing the at least one type of group are as described above.

In formula (3), $R_4$ to $R_7$ each independently represent a hydrogen atom, a halogen atom or a hydrocarbon group optionally containing a heteroatom, at least one of $R_4$ to $R_7$ represents a hydrocarbon group, and the total number of carbon atoms contained in the groups $R_4$ to $R_7$ is 5 or more.

The hydrocarbon group is as defined above. In formula (3), a preferred embodiment of the hydrocarbon group is a hydrocarbon group (e.g., an aliphatic hydrocarbon group, an aromatic hydrocarbon group or a combination thereof) optionally containing —$X_1$—, —$N(R_a)$—, —$C(=X_2)$—, —$CON(R_b)$—, —$C(=X_2)X_4$—, —$SO_2N(R_c)$—, or a halogen atom, and a group represented by formula (4) below is more preferable. If the group used is represented by formula (4), the SH group-containing compound has more excellent dispersibility in the insulating resin and the effect of suppressing ion migration is further improved.

$$*-L_1-R_8 \quad \text{Formula (4)}$$

In formula (4), $L_1$ represents a single bond, —O—, —$NR_{11}$—, —CO—, —$C(R_9)(R_{10})$—, or a group as a combination thereof. $R_9$ to $R_{11}$ each independently represent a hydrogen atom or an aliphatic hydrocarbon group.

$R_8$ represents an aliphatic hydrocarbon group, an aromatic hydrocarbon group, or a combination group thereof. Preferred embodiments of the aliphatic hydrocarbon group and the aromatic hydrocarbon group are as described above.

In formula (4), an asterisk (*) represents a binding position.

Another preferred embodiment of the hydrocarbon group is a hydrocarbon group containing one or more tertiary carbon atoms and/or one or more quaternary carbon atoms. Specific examples of the hydrocarbon group containing one or more tertiary carbon atoms and/or one or more quaternary carbon atoms are as described above.

Still another preferable embodiment of the hydrocarbon group is a hydrocarbon group containing at least one type of group represented by one formula selected from the group consisting of formulae (B-1) to (B-7) shown above. Specific examples of the hydrocarbon group containing the at least one type of group are as described above.

In formula (3), at least one of $R_4$ to $R_7$ represents a hydrocarbon group optionally containing a heteroatom. In particular, one or two of $R_4$ to $R_7$ are each preferably such a hydrocarbon group and one of them is more preferably such a hydrocarbon group in terms of more excellent effect of suppressing migration.

The sum of the numbers of carbon atoms contained in the groups $R_4$ to $R_7$ is 5 or more. In other words, the total number (total number of carbon atoms) obtained by summing the number of carbon atoms in $R_4$, the number of carbon atoms in $R_5$, the number of carbon atoms in $R_6$ and the number of carbon atoms in $R_7$ should be 5 or more. The total number in a preferred embodiment is as described above.

The method of manufacturing the SH group-containing compound that may be used in the invention is not particularly limited and the SH group-containing compound can be manufactured by a variety of methods.

The synthesis methods described in the specifications of JP 46-19039 B and JP 9-319022 A, the synthesis method described in the specification of U.S. Pat. No. 3,212,892 B, and the synthesis method described in the specification of EP 742210 B can be used to manufacture the compounds represented by formula (1), formula (2) and formula (3), respectively, but the methods used are not limited thereto.

The weight relationship between the insulating resin and the compound in the composition is not particularly limited and the weight ratio (A/B) of the weight A of the compound to the weight B of the insulating resin is preferably up to 0.20 and more preferably up to 0.10 in terms of more excellent ability to suppress migration. Although the lower limit is not particularly limited, the weight ratio is preferably 0.0001 or more and more preferably 0.0005 or more because specified effects are obtained from a small amount of the composition.

(Optional Ingredient)

The composition optionally contains a solvent. By incorporating a solvent in the composition, the handleability of the composition is improved to facilitate the formation of a silver ion diffusion-suppressing layer having a desired film thickness on the insulating substrate.

The type of the solvent to be used is not particularly limited and examples thereof include water and an organic solvent.

Examples of the organic solvent that may be used include alcoholic solvents (e.g., methanol, ethanol, isopropanol, sec-butanol, carbitol, diethylene glycol monoethyl ether); ketone solvents (e.g., acetone, methyl ethyl ketone and cyclohexanone); aromatic hydrocarbon solvents (e.g., toluene and xylene); amide solvents (e.g., formamide, dimethylacetamide, N-methylpyrrolidone and dimethylpropyleneurea); nitrile solvents (e.g., acetonitrile and propionitrile); ester solvents (e.g., methyl acetate and ethyl acetate); carbonate solvents (e.g., dimethyl carbonate and diethyl carbonate); ether solvents; and halogenated solvents. These solvents may be used as a mixture of two or more.

When the composition contains a solvent, its content is not particularly limited and is preferably from 20 to 80 wt % and more preferably from 25 to 75 wt % with respect to the total amount of the composition.

It is preferable for the composition to be substantially free from silver ions because the silver ion diffusion-suppressing layer has more excellent ability to suppress ion migration. If the composition contains an excessive amount of silver ions, the silver ion diffusion-suppressing layer will contain a large amount of silver ions, which may reduce the effect of suppressing silver ion migration.

The expression "substantially free from silver ions" means that the content of silver ions in the composition is up to 1 µmol/L, more preferably up to 0.1 µmol/L and most preferably 0 mol/L.

The composition may optionally contain a known stabilizing additive such as an antioxidant for the purpose of maintaining the stability of the insulating resin.

<Film for Silver Ion Diffusion-Suppressing Layer>

The film for the silver ion diffusion-suppressing layer according to the invention (hereinafter also referred to simply as "film") is a resin film containing the above-described insulating resin and SH group-containing compound. The film is directly formed on top of the metal interconnect-bearing substrate as will be described later so as to cause the film to function as the silver ion diffusion-suppressing layer.

The insulating resin and the SH group-containing compound to be used are as described above.

The weight ratio between the insulating resin and the SH group-containing compound included in the film is not particularly limited and is preferably the above-described weight ratio between the insulating resin and the SH group-containing compound in the composition.

The film may optionally contain a known stabilizing additive such as an antioxidant for the purpose of maintaining the stability of the insulating resin.

The thickness of the film is not particularly limited and is preferably from 10 to 1,000 μm and more preferably from 15 to 500 μm in terms of handleability and also ensuring the insulating properties between the metal interconnects.

The film-manufacturing method is not particularly limited and in cases where the above-described composition for forming the silver ion diffusion-suppressing layer is a liquid containing a solvent, a film can be manufactured by applying the composition onto a substrate, removing the solvent, forming the composition into a film shape, and peeling the composition in the film shape from the substrate. Alternatively, a film may be manufactured by directly extruding a mixture containing the insulating resin and the SH group-containing compound into a film.

<Circuit Board and its Manufacturing Method>

Next, the circuit board and its manufacturing method according to the invention are described in detail. An embodiment of the circuit board is first described in detail.

The circuit board includes an insulating substrate, metal interconnects disposed on the insulating substrate and containing silver or a silver alloy and a silver ion diffusion-suppressing layer disposed on the metal interconnects and covering the metal interconnects, and the silver ion diffusion-suppressing layer contains an insulating resin and an SH group-containing compound.

More specifically, as shown in FIG. 1, a circuit board 10 includes a metal interconnect-bearing insulating substrate 16 including an insulating substrate 12 and metal interconnects 14 disposed on the insulating substrate 12, and a silver ion diffusion-suppressing layer 18 covering the metal interconnects 14.

Figure 2:
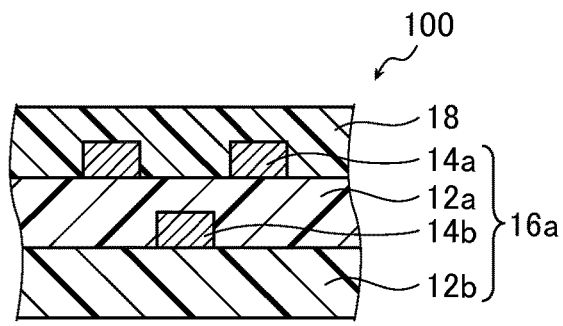
FIG. 2 is a schematic cross-sectional view of another preferred embodiment of the circuit board of the invention.

FIG. 1 shows an example in which the metal interconnects 14 are of a one-layer interconnection structure but this is not the sole case of the invention. For instance, as shown in FIG. 2, a metal interconnect-bearing insulating substrate 16a (multilayer circuit board) in which a plurality of metal interconnects 14a, 14b and insulating substrates 12a, 12b are alternately formed may be used to form a circuit board 100 of a multilayer interconnection structure.

The respective members are described below in detail.

[Metal Interconnect-Bearing Insulating Substrate]

The metal interconnect-bearing insulating substrate (inner layer substrate) for use in this step includes an insulating substrate and metal interconnects containing silver or a silver alloy (silver interconnects, silver alloy interconnects) which are disposed on the insulating substrate. In FIG. 1, the metal interconnects 14 are formed only on one side of the insulating substrate 12 but may be formed on both sides thereof. In other words, the metal interconnect-bearing insulating substrate 16 may be a single-sided substrate or a double-sided substrate.

In cases where the metal interconnects 14 are formed on both sides of the insulating substrate 12, the silver ion diffusion-suppressing layer 18 may be also formed on both sides.

The insulating substrate is not particularly limited in type as long as it has insulating properties and can support the metal interconnects. For instance, substrates such as an organic substrate, a ceramic substrate and a glass substrate may be used.

The insulating substrate may be of a structure in which at least two substrates selected from the group consisting of an organic substrate, a ceramic substrate and a glass substrate are formed on top of each other.

An exemplary material of the organic substrate is a resin and, for example, a thermosetting resin, a thermoplastic resin or a mixture of these resins is preferably used. Examples of the thermosetting resin include phenol resin, urea resin, melamine resin, alkyd resin, acrylic resin, unsaturated polyester resin, diallyl phthalate resin, epoxy resin, silicone resin, furan resin, ketone resin, xylene resin and benzocyclobutene resin. Examples of the thermoplastic resin include polyimide resin, polyphenylene oxide resin, polyphenylene sulfide resin, aramid resin and liquid crystal polymer.

As the material of the organic substrate, glass woven fabric, glass non-woven fabric, aramid woven fabric, aramid non-woven fabric, and aromatic polyamide woven fabric, and materials obtained by impregnating such fabrics with the above-described resins may also be used.

The metal interconnects are primarily composed of silver or a silver alloy. In cases where the metal interconnects are composed of a silver alloy, for example, metals such as tin, palladium, gold, nickel and chromium are contained in addition to silver. As long as the effects of the invention are not impaired, the metal interconnects may contain, for example, a resin ingredient such as a binder or a photosensitive compound, and further optionally contain other ingredients.

The process for forming the metal interconnects on the insulating substrate is not particularly limited and a known process may be applied. Typical exemplary processes include a subtractive process using etching treatment, a semi-additive process using electrolytic plating, a process which involves the use of silver paste (e.g., paste containing silver nanoparticles or silver nanowires) to prepare metal interconnects, the process as disclosed in JP 2009-188360 A that involves the use of a photosensitive material, a vacuum deposition process, a sputtering film deposition process and an ion plating process.

The silver paste is a conductive, pasty material (paste) obtained by dispersing silver particles having predetermined particle sizes in a suitable solvent such as a resin binder, and is used in, for example, sample attachment or conductive treatment. Commercially available ones include PELTRON K-3424LB (trade name) manufactured by Pelnox, Ltd.

The width of the metal interconnects is not particularly limited and is preferably from 0.1 to 1,000 μm, more preferably from 0.1 to 50 μm and even more preferably from 0.1 to 20 μm in terms of higher levels of integration of the circuit board.

The spacing between the metal interconnects is not particularly limited and is preferably from 0.1 to 1,000 μm more preferably from 0.1 to 50 μm and even more preferably from 0.1 to 20 μm in terms of higher levels of integration of the circuit board.

The pattern shape of the metal interconnects is not particularly limited and the metal interconnects may have any pattern. Examples of the pattern shape include a linear shape, a curved shape, a rectangular shape and a circular shape.

The thickness of the metal interconnects is not particularly limited and is preferably from 0.05 to 1,000 μm, more preferably from 0.1 to 25 μm and even more preferably from 0.1 to 20 μm in terms of higher levels of integration of the circuit board.

The metal interconnect-bearing insulating substrate should be of a laminated structure including at least an insulating substrate and metal interconnects disposed in the outermost layer, and other layers (e.g., a metal interconnect layer and an insulating interlayer) may be disposed between the insulating substrate and the metal interconnects.

Through-holes may be formed in the insulating substrate. In cases where the metal interconnects are formed on both sides of the insulating substrate, conduction between the metal interconnects on both sides may be established by filling the through-holes with metal (e.g., silver or a silver alloy).

[Silver Ion Diffusion-Suppressing Layer]

The silver ion diffusion-suppressing layer is a layer disposed on a surface of the metal interconnect-bearing insulating substrate on the metal interconnect side, covering the surfaces of the metal interconnects and used to suppress silver ion migration between the metal interconnects.

The silver ion diffusion-suppressing layer contains the above-described insulating resin and SH group-containing compound.

The weight ratio between the SH group-containing compound and the insulating resin in the silver ion diffusion-suppressing layer is not particularly limited and is preferably the above-described weight ratio between the SH group-containing compound and the insulating resin in the film.

The silver ion diffusion-suppressing layer is preferably substantially free from silver ions or silver metal. If the silver ion diffusion-suppressing layer contains silver ions or silver metal in an excessive amount, the effect of suppressing silver ion migration may be reduced.

The silver ion diffusion-suppressing layer may optionally contain a known stabilizing additive such as an antioxidant for the purpose of maintaining the stability of the insulating resin.

Although the thickness of the silver ion diffusion-suppressing layer is not particularly limited, the thickness is preferably from 5 to 1,000 µm and more preferably from 10 to 500 µm in terms of more excellent ability to suppress ion migration of the silver ion diffusion-suppressing layer.

(Method of Manufacturing Circuit Board)

The circuit board-manufacturing method is not particularly limited and in cases where the above-described composition for forming the silver ion diffusion-suppressing layer is a liquid containing a solvent, a method is applied which involves applying the composition onto the metal interconnect-bearing insulating substrate and removing the solvent to form the silver ion diffusion-suppressing layer. Another exemplary method involves directly laminating the above-described film for the silver ion diffusion-suppressing layer on the metal interconnect-bearing insulating substrate.

The foregoing method which involves application of the composition is preferable because it is easy to adjust the thickness of the silver ion diffusion-suppressing layer.

The process used to apply the composition for forming the silver ion diffusion-suppressing layer onto the metal interconnect-bearing insulating substrate is not particularly limited, and known processes such as a dispensing process, a screen printing process, a curtain coating process, a bar coating process, a spin coating process, an inkjet coating process and a dip coating process can be applied. A dispensing process, a screen printing process, a spin coating process and an inkjet coating process are preferable because the coating weight of the silver ion diffusion-suppressing layer is more easily controlled.

In cases where the insulating resin is a curable resin, application of the composition may be optionally followed by heating treatment or light exposure treatment.

In cases where heating treatment is to be performed, an optimal heating temperature is appropriately selected according to the thermosetting resin used and is usually in a preferable range of 100 to 300° C. or a more preferable range of 100 to 250° C. The heating time is preferably from 0.2 to 10 hours and more preferably from 0.5 to 5 hours in terms of productivity.

In addition, in cases where light exposure treatment is to be performed, light having an optimal wavelength is appropriately selected as the light for use in light exposure according to the photo-curable resin used. Examples of the light include ultraviolet light and visible light. The exposure time is preferably from 0.2 to 10 hours and more preferably from 0.5 to 5 hours in terms of productivity.

<Insulating Layer-Forming Step and Insulating Layer-Bearing Circuit Board>

An insulating layer may be further optionally formed on a surface of the circuit board obtained above on its silver ion diffusion-suppressing layer side. By further forming the insulating layer on the silver ion diffusion-suppressing layer, interconnects can be further formed on the thus formed insulating layer to obtain a multilayer circuit board.

Figure 3:
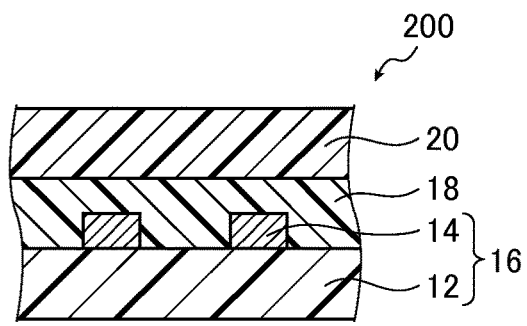
FIG. 3 is a schematic cross-sectional view of a preferred embodiment of a circuit board having an insulating layer according to the invention.

To be more specific, an insulating layer-bearing circuit board 200 has an insulating layer 20 disposed on a silver ion diffusion-suppressing layer 18 as shown in FIG. 3.

The materials used for the insulating layer are first described below and the procedure of the manufacturing method is then described.

(Insulating Layer)

Any known insulating material may be used as the material of the insulating layer. Examples of the insulating material include epoxy resin, aramid resin, crystalline polyolefin resin, amorphous polyolefin resin, fluorine-containing resins (e.g., polytetrafluoroethylene, fully fluorinated polyimide and fully fluorinated amorphous resin), polyimide resin, polyethersulfone resin, polyphenylene sulfide resin, polyether ether ketone resin and acrylate resin.

A so-called optically clear adhesive (OCA) sheet may also be used for the insulating layer. Commercially available OCA sheets such as 8171CL series and 8146 series manufactured by 3M Company are usable.

A so-called solder resist layer may also be used for the insulating layer. Commercial products such as PFR800 and PSR4000 (trade names) manufactured by Taiyo Ink Mfg. Co., Ltd. and SR7200G manufactured by Hitachi Chemical Co., Ltd. may be used for the solder resist.

In particular, the insulating layer preferably contains resin having an epoxy group or a (meth)acrylate group. The resin easily binds to the above-described silver ion diffusion-suppressing layer and as a result improves the adhesion of the insulating layer and consequently further improves the effect of suppressing silver ion migration.

The resin is preferably the primary ingredient of the insulating layer. The expression "primary ingredient" means that the amount of the resin is at least 50 wt % and preferably at least 60 wt % of the total amount of the insulating layer. The upper limit is 100 wt %.

A known epoxy resin may be used as the epoxy group-containing resin. For example, resins such as glycidyl ether epoxy resin, glycidyl ester epoxy resin and glycidyl amine epoxy resin may be used.

The (meth)acrylate group-containing resin to be used may be a known resin. For example, resins such as acrylate resin and methacrylate resin may be used.

(Procedure of Manufacture)

The method of forming the insulating layer on the circuit board is not particularly limited and a known method may be applied. Exemplary methods include a method which involves directly laminating a film of the insulating layer on the circuit board, a method which involves applying a composition for forming the insulating layer containing ingredients constituting the insulating layer onto the circuit board, and a method which involves immersing the circuit board in a composition for forming the insulating layer.

The composition for forming the insulating layer may optionally contain a solvent. In cases where the composition for forming the insulating layer which contains a solvent is used, heating treatment for removing the solvent may optionally be performed after the composition is applied onto the circuit board.

Treatment for applying energy to the insulating layer (e.g., light exposure or heating treatment) may optionally be performed after the insulating layer is formed on the circuit board.

The thickness of the insulating layer to be formed is not particularly limited and is preferably from 5 to 50 μm and more preferably from 10 to 40 μm in terms of the insulation reliability between the metal interconnects.

The resulting insulating layer-bearing circuit board may be used as a circuit assembly by mounting semiconductor chips after the insulating layer is partially removed from the circuit board by drilling or laser machining.

For example in cases where solder resist is used as the insulating layer, a mask with a predetermined pattern is put on the insulating layer, energy is applied to cure a region of the insulating layer where energy is applied, and the other region of the insulating layer where energy is not applied is removed to bare the metal interconnects. Next, the surfaces of the bared metal interconnects are washed by a known method using, for example, sulfuric acid, a soft etching agent, an alkali or a surfactant, and semiconductor chips are then mounted on the surfaces of the metal interconnects.

Other metal interconnects may be further formed on the resulting insulating layer. The method of forming the metal interconnects is not particularly limited and known methods (e.g., plating treatment and sputtering treatment) may be used.

In the practice of the invention, it is possible to use a board obtained by further providing metal interconnects on the insulating layer disposed as the outermost layer in the resulting insulating layer-bearing circuit board as a new metal interconnect-bearing insulating substrate (inner layer substrate) and to newly stack one or more insulating layers and one or more metal interconnect layers on top of each other.

(Application)

The circuit board and the insulating layer-bearing circuit board according to the invention can be used in various applications and structures. Exemplary applications include a panel substrate for a plasma display panel, a substrate for a solar cell electrode, a membrane circuit board and a substrate for a touch panel electrode.

The circuit board and the insulating layer-bearing circuit board according to the invention are preferably incorporated in electronic devices. Exemplary electronic devices include touch panels or membrane switches and devices equipped therewith, such as television sets, mobile communication devices, personal computers, game consoles, in-vehicle display devices and network communication devices; LEDs for illumination and for display; electronic wiring devices concerning the control of solar cells; wireless communications devices such as RFID systems; and instruments in which the drive is controlled by semiconductor circuit boards or organic TFT circuit boards.

<Conductive Film Laminate>

Next, a preferred embodiment of a conductive film laminate of the invention is described below in detail with reference to the drawings.

Figure 4:
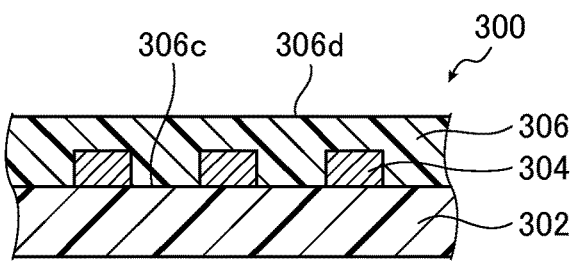
FIG. 4 is a schematic cross-sectional view of an embodiment of a conductive film laminate of the invention.

FIG. 4 shows a schematic cross-sectional view of an embodiment of the conductive film laminate. A conductive film laminate 300 includes a transparent substrate 302, a conductive film 304 containing silver or a silver alloy and disposed on the transparent substrate 302, and a transparent double-sided adhesive sheet 306 attached onto the conductive film 304.

The respective members (the transparent substrate 302, the conductive film 304 and the transparent double-sided adhesive sheet 306) are described below in detail.

<Transparent Substrate>

The transparent substrate is not particularly limited in type as long as it supports the conductive film and the transparent double-sided adhesive sheet to be described later and is transparent to visible light.

In addition to glass, for example, a polymer resin is used as the material of the transparent substrate. Examples of the polymer resin include polyolefins such as polyethylene and polypropylene, polyethylene terephthalate, polybutylene terephthalate, polyethylene naphthalate, polycarbonate, polyether sulfone, polysulfone, polyarylate, cyclic polyolefin, and polyimide.

The shape of the transparent substrate is not particularly limited and examples thereof include a plate shape and a film shape.

The thickness of the transparent substrate is not particularly limited. When the conductive film laminate is applied to a touch panel, the transparent substrate preferably has a thickness of 0.01 to 3.0 mm and more preferably 0.05 to 1.5 mm.

The transparent substrate preferably has high transparency in the visible light range and preferably has a total light transmittance of 80% or more.

The transparent substrate may have an additional functional layer such as an undercoat layer. Exemplary additional functional layers include a matting agent layer, a protective layer, a solvent-resistant layer, an antistatic layer, a smoothing layer, an adhesion-improving layer, a lightproof layer, an antireflection layer, a hard coat layer, a stress relaxation layer, an antifogging layer, an anti-staining layer, a printing layer and an easily adhesive layer. These may be used as a single layer or two or more of them may be stacked on top of each other.

<Conductive Film>

The conductive film is disposed on the transparent substrate and is primarily composed of silver or a silver alloy. When used in the application to a touch panel, the conductive film can be utilized as a transparent electrode of the touch panel or its peripheral interconnect. As long as the effects of the invention are not impaired, the conductive film may contain, for example, a resin ingredient such as a binder or a photosensitive compound, and further optionally contain other ingredients.

In cases where the conductive film is composed of a silver alloy, metals such as tin, palladium, gold, nickel and chromium are contained in the film in addition to silver.

The pattern shape of the conductive film is not particularly limited, and the conductive film may be provided on a part of the surface of the transparent substrate as shown in FIG. 4 or on the whole surface thereof.

The thickness of the conductive film is not particularly limited and is preferably from 0.05 to 100 μm, more preferably from 0.1 to 20 μm and even more preferably from 0.1 to 10 μm in terms of the application of the conductive film laminate to a touch panel.

When used as the transparent electrode of a touch panel, the conductive film preferably has high transparency in the visible light range and preferably has a total light transmittance of 80% or more.

The process for forming the conductive film is not particularly limited and examples thereof include physical film deposition processes such as a vapor deposition process and a sputtering process; a chemical vapor-phase process such as a CVD process; a process which involves applying silver paste containing silver nanoparticles or silver nanowires to form the conductive film; and the process as disclosed in JP 2009-188360 A that makes use of a silver salt.

When used as the transparent electrode of a touch panel or the like, the conductive film preferably contains metal nanowires composed of silver or a silver alloy (hereinafter also referred to simply as "metal nanowires"). By using the metal nanowires, the conductive film can be formed at a low temperature, whereby a transparent electrode having a high transmittance and a low resistance can be provided.

<Metal Nanowire>

The metal nanowires are composed of silver or a silver alloy. The type of the silver alloy is as described above.

A metal nanowire refers to a wire having electrical conductivity and having such a shape that the length in the long axis direction is sufficiently larger than the diameter (the length in the short axis direction). The metal nanowires may be in the form of solid fibers or hollow fibers.

The material of the metal nanowires is most preferably silver or an alloy of silver and other metals in terms of excellent electrical conductivity.

Exemplary other metals that may be used in the silver alloy include platinum, osmium, palladium, iridium, tin, bismuth and nickel. These may be used alone or in combination of two or more.

The average short axis length (hereinafter sometimes referred to as "average short axis diameter" or "average diameter") of the metal nanowires is preferably from 5 to 50 nm, more preferably from 5 to 25 nm and most preferably from 5 to 20 nm.

An average short axis length of less than 5 nm may often deteriorate the oxidation resistance and durability. On the other hand, an average short axis length exceeding 50 nm may often increase scattering of the metal nanowires to increase the haze value of the conductive film. Particularly by adjusting the average short axis length to 25 nm or less, the scattering of the metal nanowires can be reduced to significantly improve (reduce) the haze value of the conductive film. A touch panel using a conductive film with a small haze value is capable of solving a problem lying in that the pattern shape of the conductive film is liable to be observed, and the visibility of the touch panel is improved.

The average short axis length of the metal nanowires is determined from the average value obtained by observing 300 metal nanowires with a transmission electron microscope (TEM; JEM-2000FX manufactured by JEOL Ltd.). In cases where the cross-sectional shape of the metal nanowires is not circular, the maximum length is used as the short axis length.

The average long axis length (hereinafter sometimes referred to as "average length") of the metal nanowires is preferably 5 μm or more, more preferably from 5 μm to 40 μm and even more preferably from 5 μm to 30 μm.

When the average long axis length is less than 5 μm, it is difficult to form a dense network and sufficient electrical conductivity can often not be obtained. On the other hand, when the average long axis length exceeds 40 μm, the metal nanowires are excessively long to get entangled during manufacture and aggregates may often be formed during the manufacturing process.

The average long axis length of the metal nanowires is, for example, determined from the average value obtained by observing 300 metal nanowires with a transmission electron microscope (TEM; JEM-2000FX manufactured by JEOL Ltd.). When a metal nanowire is curved, a circle having the arc of the metal nanowire is taken into account and the value calculated from the radius and the curvature of the circle is used as the long axis length.

The method of manufacturing the metal nanowires is not particularly limited but the metal nanowires may be manufactured by any method. However, the metal nanowires are preferably manufactured by reducing metal ions in a solvent in which a halogen compound and a dispersant are dissolved. After the formation of the metal nanowires, demineralization is preferably performed by a common method in terms of the dispersibility and long-term stability of the conductive film.

The methods described in JP 2009-215594 A, JP 2009-242880 A, JP 2009-299162 A, JP 2010-84173 A, JP 2010-86714 A, JP 2009-505358 A and the like may be used to manufacture the metal nanowires.

The aspect ratio of the metal nanowires can be appropriately selected according to the intended purpose and is not particularly limited if it is 10 or more. The aspect ratio is more preferably 50 or more, even more preferably 100 or more, still even more preferably 5,000 or more, and most preferably from 10,000 to 100,000. In general, the aspect ratio refers to a ratio of the longer side length to the shorter side length of a fibrous member (i.e., a ratio of the average long axis length to the average short axis length).

The method of measuring the aspect ratio is not particularly limited but is selectable appropriately to the intended purpose, and an example thereof is a method which involves measuring with an electron microscope or the like.

When measured by an electron microscope, the aspect ratio of the metal nanowires has only to be determined in one visual field of the electron microscope. The overall aspect ratio of the metal nanowires can be estimated by separately measuring the average long axis length and the average short axis length of the metal nanowires.

When a metal nanowire has a tubular shape, the external diameter of the tubular nanowire is used as the diameter for calculating the aspect ratio.

<Conductive Film Containing Metal Nanowires Composed of Silver or Silver Alloy>

Although the method of forming a conductive film containing metal nanowires composed of silver or a silver alloy is not particularly limited, it is preferable to use a composition containing, in addition to the metal nanowires, at least (1) a photosensitive composition containing at least a binder and a photopolymerizable composition, (2) a sol-gel cured product, or (3) a composition containing at least a polymer, as a matrix ingredient.

The weight ratio between the weight of the matrix ingredients (all the ingredients excluding the metal nanowires and the solvent included in the conductive film) and the weight of the metal nanowires is preferably from 0.5 to 15, more preferably from 1.0 to 12, and most preferably from 2.0 to 10. A weight ratio of less than 0.5 may reduce the adhesion of the metal nanowires to the substrate surface and lower the film strength because of a small amount of the binder ingredient, while a weight ratio exceeding 15 may increase the surface resistance value of the conductive film.

The materials for use as a matrix ingredient are described below in detail.

(Binder)

A suitable binder can be selected from among high molecular weight, linear organic polymers that are each an alkali-soluble resin having at least one group enhancing alkali solubility (e.g., carboxy group, phosphoric acid group, sulfonic acid group) in the molecule (preferably in the molecule having an acrylic copolymer or a styrenic copolymer as its main chain).

Of these, a binder which is soluble in an organic solvent and is also soluble in an aqueous alkali solution and which has an acid-dissociable group and is made alkali-soluble when the acid-dissociable group is dissociated by the action of an acid is most preferable.

The acid-dissociable group as used herein refers to a functional group capable of dissociation in the presence of an acid.

For example, a known method using radical polymerization may be applied to manufacture the binder. A person skilled in the art can easily set polymerization conditions upon manufacture of an alkali-soluble resin by radical polymerization, such as the temperature, the pressure, the type and amount of the radical initiator used, and the type of the solvent used, and such conditions can be empirically determined.

A polymer having a carboxylic acid in the side chain is preferable as the high molecular weight, linear organic polymer.

Examples of the polymer having a carboxylic acid in the side chain include polymers as described in JP 59-44615 A, JP 54-34327 B, JP 58-12577 B, JP 54-25957 B, JP 59-53836 A and JP 59-71048 A, as exemplified by a methacrylic acid copolymer, an acrylic acid copolymer, an itaconic acid copolymer, a crotonic acid copolymer, a maleic acid copolymer, a partially esterified maleic acid copolymer, an acidic cellulose derivative having a carboxylic acid in the side chain, and a hydroxyl group-containing polymer to which an acid anhydride is added. In addition, a high molecular weight polymer having (meth)acryloyl group in the side chain is also a preferable example.

Of these, a benzyl (meth)acrylate/(meth)acrylic acid copolymer, and a multi-component copolymer composed of benzyl (meth)acrylate, (meth)acrylic acid and other monomers are particularly preferable.

In addition, a high molecular weight polymer having (meth)acryloyl group in the side chain and a multi-component copolymer composed of (meth)acrylic acid, glycidyl (meth)acrylate and other monomers are also useful examples. These polymers may be mixed in any amounts and used.

Other examples of the high molecular weight, linear organic polymer include polymers described in JP 7-140654 A, such as a 2-hydroxypropyl (meth)acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, and a 2-hydroxyethyl methacrylate/polystyrene macromonomer/benzyl methacrylate/methacrylic acid copolymer.

Specific structural units in the alkali-soluble resin that may be suitably used are (meth)acrylic acid and other monomers copolymerizable with the (meth)acrylic acid.

Exemplary other monomers copolymerizable with the (meth)acrylic acid include an alkyl (meth)acrylate, an aryl (meth)acrylate and a vinyl compound. In these monomers, a hydrogen atom of each of the alkyl group and the aryl group may be substituted with a substituent.

Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, dicyclopentanyl (meth)acrylate, dicyclopentenyl (meth)acrylate, dicyclopentenyloxyethyl (meth)acrylate, glycidyl methacrylate, tetrahydrofurfuryl methacrylate, and polymethyl methacrylate macromonomer. These may be used alone or in combination of two or more.

Examples of the vinyl compound include styrene, α-methylstyrene, vinyl toluene, acrylonitrile, vinyl acetate, N-vinylpyrrolidone, polystyrene macromonomer, and $CH_2=CR^8R^9$ [where $R^8$ represents a hydrogen atom or an alkyl group containing 1 to 5 carbon atoms and $R^9$ represents an aromatic hydrocarbon ring containing 6 to 10 carbon atoms]. These may be used alone or in combination of two or more.

The weight-average molecular weight of the binder is preferably from 1,000 to 500,000, more preferably from 3,000 to 300,000 and even more preferably from 5,000 to 200,000 in terms of the alkali dissolution rate and the physical film properties.

The weight-average molecular weight is measured by gel permeation chromatography and can be determined using a standard polystyrene calibration curve.

The binder content is preferably from 5 to 90 wt %, more preferably from 10 to 85 wt % and even more preferably from 20 to 80 wt % with respect to the total weight of the solids in the photopolymerizable composition containing the above-described metal nanowires. When the binder content is within the foregoing range, the developability and the electrical conductivity of the metal nanowires can be achieved at the same time.

(Photopolymerizable Composition)

The photopolymerizable composition refers to a composition which imparts the function of forming an image through exposure to light to the conductive film or triggers the image formation. The photopolymerizable composition includes, as its basic ingredients, (a) an addition-polymerizable unsaturated compound and (b) a photopolymerization initiator generating a radical upon light irradiation.

[(a) Addition-Polymerizable Unsaturated Compound]

The addition-polymerizable unsaturated compound (hereinafter also referred to as "polymerizable compound") used as the ingredient (a) is a compound polymerizable by an addition polymerization reaction in the presence of a radical, and use is usually made of a compound preferably having at least one, more preferably at least two, even more preferably at least four and still even more preferably at least six ethylenically unsaturated double bonds at the end of the molecule.

These have chemical forms such as a monomer, a prepolymer (i.e., a dimer, a trimer or an oligomer) or a mixture thereof.

Various compounds are known as such polymerizable compounds and they can be used as the ingredient (a).

Of these, trimethylolpropane tri(meth)acrylate, pentaerythritol tetra(meth)acrylate, dipentaerythritol hexa(meth)acrylate, and dipentaerythritol penta(meth)acrylate are the most preferable polymerizable compounds in terms of the film strength.

The content of the ingredient (a) is preferably from 2.6 to 37.5 wt % and more preferably from 5.0 to 20.0 wt % with respect to the total weight of the solids in the photopolymerizable composition containing the above-described metal nanowires.

[(b) Photopolymerization Initiator]

The photopolymerization initiator used as the ingredient (b) is a compound which generates a radical upon light irradiation. Examples of the photopolymerization initiator include a compound generating, upon light irradiation, an acid radical which is finally converted into an acid and a compound generating another radical. In the following, the former is called "photoacid generator" and the latter "photo radical generator."

—Photoacid Generator—

The photoacid generator to be used can be appropriately selected from among a photo-cationic polymerization initiator, a photo-radical polymerization initiator, a photo-decoloring agent of dyes, a photo-discoloring agent, a known compound used for microresist or the like that generates an acid radical upon irradiation with actinic rays or radiation, and a mixture thereof.

The photoacid generator as described above is not particularly limited but may be appropriately selected according to the intended purpose, and examples thereof include a triazine having at least one di- or trihalomethyl group, 1,3,4-oxadiazole, naphthoquinone-1,2-diazido-4-sulfonyl halide, a diazonium salt, a phosphonium salt, a sulfonium salt, an iodonium salt, imide sulfonate, oxime sulfonate, diazodisulfone, disulfone, and o-nitrobenzyl sulfonate. Of these, imide sulfonate, oxime sulfonate and o-nitrobenzyl sulfonate which are compounds generating sulfonic acid are particularly preferable.

Use may be made of compounds in which a group or a compound generating an acid radical upon irradiation with actinic rays or radiation is introduced into the main chain or the side chain of a resin, as exemplified by the compounds described in U.S. Pat. No. 3,849,137 B, DE 3914407 B, JP 63-26653 A, JP 55-164824 A, JP 62-69263 A, JP 63-146038 A, JP 63-163452 A, JP 62-153853 A and JP 63-146029 A.

In addition, the compounds described in the specifications of U.S. Pat. No. 3,779,778 B, EP 126,712 B and the like can also be used for the acid radical generator.

For example, the compounds described in JP 2011-018636 A and JP 2011-254046 A may be used as the triazine compounds.

In the practice of the invention, of the photoacid generators, compounds which generate sulfonic acid are preferable and the oxime sulfonate compounds as shown below are most preferable in terms of their high sensitivity.

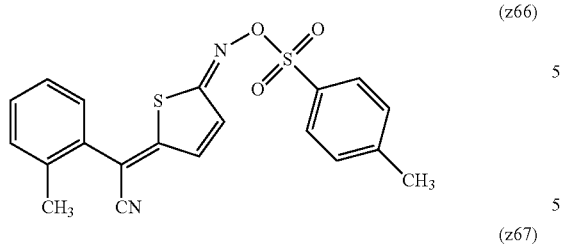

(z66)

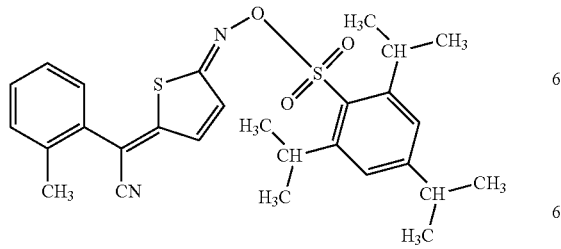

(z67)

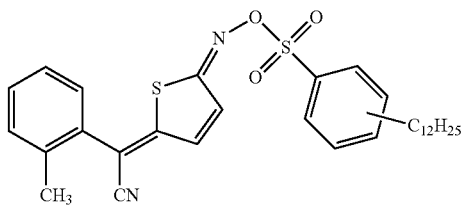

(z68)

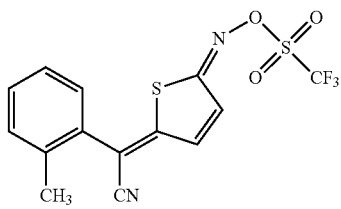

(z69)

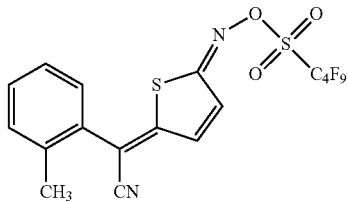

(z70)

When a compound having a 1,2-naphthoquinone diazide group is used as the photoacid generator, high sensitivity and good developability are achieved.

Of the foregoing photoacid generators, the compounds shown below in which D is independently a hydrogen atom or a 1,2-naphthoquinone diazide group are preferable in terms of their high sensitivity.

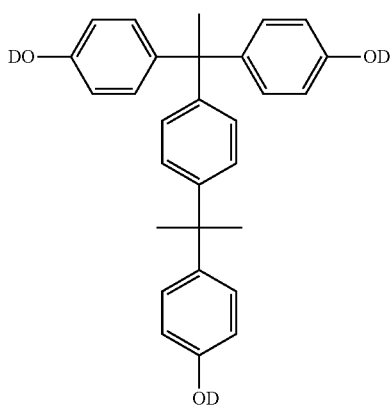

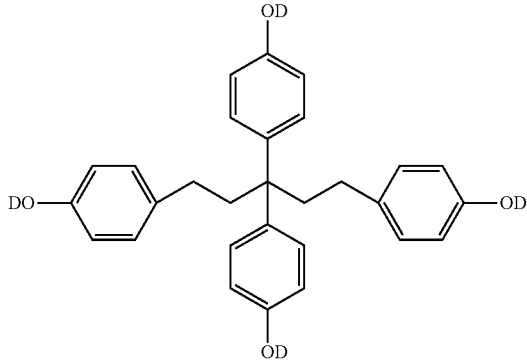

-continued

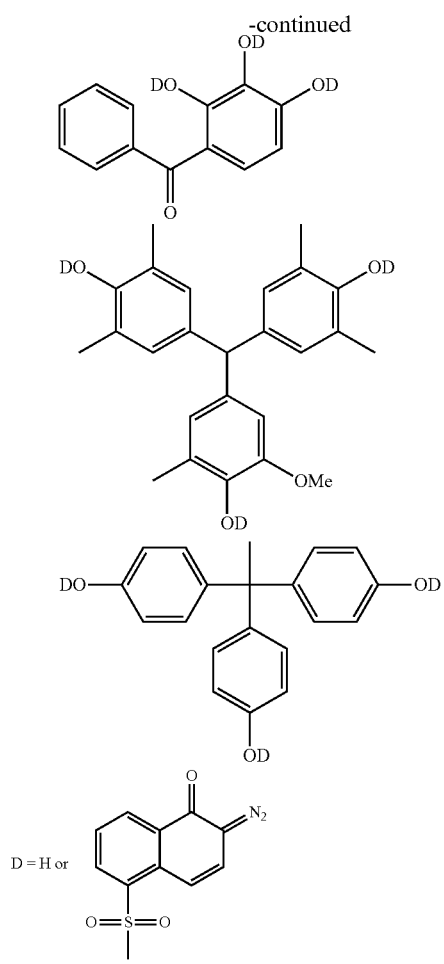

D = H or

—Photo Radical Generator—

The photo radical generator is a compound which has the function of causing a decomposition reaction or a hydrogen abstraction reaction through direct absorption of light or light sensitization to generate a radical. The photo radical generator preferably has absorption in a wavelength range of 300 nm to 500 nm.

A lot of compounds are known as such photo radical generators and exemplary compounds include a triazine compound, a carbonyl compound, a ketal compound, a benzoin compound, an acridine compound, an organic peroxide compound, an azo compound, a coumarin compound, an azide compound, a metallocene compound, a hexaaryl biimidazole compound, an organic borate compound, a disulfonate compound, an oxime ester compound, and an acyl phosphine (oxide) compound as described in JP 2008-268884 A. A suitable compound can be selected from these compounds according to the intended purpose. Of these, a benzophenone compound, an acetophenone compound, a hexaaryl biimidazole compound, an oxime ester compound or an acyl phosphine (oxide) compound is particularly preferable in terms of exposure sensitivity.

For example, the photo radical generators described in JP 2011-018636 A and JP 2011-254046 A may be used as the photo radical generators.

These photopolymerization initiators may be used alone or in combination of two or more. The photopolymerization initiator content is preferably from 0.1 to 50 wt %, more preferably from 0.5 to 30 wt % and even more preferably from 1 to 20 wt % with respect to the total weight of the solids in the photopolymerizable composition containing the metal nanowires. In cases where a pattern containing conductive regions and non-conductive regions to be described later is to be formed in the conductive film, good sensitivity and good pattern forming properties are obtained when the photopolymerization initiator content is within the above-defined range.

Exemplary additives other than the above ingredients include a chain transfer agent, a crosslinking agent, a dispersant, a solvent, a surfactant, an antioxidant, a sulfurization inhibitor, a metal corrosion inhibitor, a viscosity modifier, and a preservative.

[Chain Transfer Agent]

The chain transfer agent is used to improve the exposure sensitivity of the photopolymerizable composition. Examples of the chain transfer agent include N,N-dialkylaminobenzoic acid alkyl esters such as N,N-dimethylaminobenzoic acid ethyl ester; heterocyclic ring-containing mercapto compounds such as 2-mercaptobenzothiazole, 2-mercaptobenzoxazole, 2-mercaptobenzimidazole, N-phenylmercaptobenzimidazole, 1,3,5-tris(3-mercaptobutyloxyethyl)-1,3,5-triazine-2,4,6(1H,3H,5H)-trione; and aliphatic polyfunctional mercapto compounds such as pentaerythritol tetrakis(3-mercaptopropionate), pentaerythritol tetrakis(3-mercaptobutyrate) and 1,4-bis(3-mercaptobutyryloxy)butane. These may be used alone or in combination of two or more.

The chain transfer agent content is preferably from 0.01 to 15 wt %, more preferably from 0.1 to 10 wt % and even more preferably from 0.5 to 5 wt % with respect to the total weight of the solids in the photopolymerizable composition containing the above-described metal nanowires.

[Crosslinking Agent]

The crosslinking agent is a compound which may form a chemical bond using a free radical or an acid or through heating to cure the conductive film, and examples thereof include a melamine compound substituted with at least one group selected from among methylol group, alkoxymethyl group and acyloxymethyl group, a guanamine compound, a glycoluril compound, a urea compound, a phenol compound or phenolic ether compound, an epoxy compound, an oxetane compound, a thioepoxy compound, an isocyanate compound, an azide compound, and a compound having an ethylenically unsaturated group including methacryloyl group or acryloyl group. Of these, an epoxy compound, an oxetane compound and a compound having an ethylenically unsaturated group are particularly preferable in terms of physical film properties, heat resistance and solvent resistance.

An oxetane resin may be used alone or as a mixture with an epoxy resin. In particular, an oxetane resin is preferably used in combination with an epoxy resin in terms of the high reactivity and the improved physical film properties.

When a compound having an ethylenically unsaturated double bond group is used as the crosslinking agent, it should be taken into account that the crosslinking agent in question is also included in the polymerizable compound and its content is included in the polymerizable compound content according to the invention.

The crosslinking agent content is preferably from 1 to 250 parts by weight, and more preferably from 3 to 200 parts by weight, based on 100 parts by weight (the total weight) of the solids in the photopolymerizable composition containing the above-described metal nanowires.

[Dispersant]

The dispersant is used to disperse the above-described metal nanowires in the photopolymerizable composition while preventing them from aggregating. The dispersant is not particularly limited as long as the metal nanowires can be dispersed, and a suitable dispersant can be selected according to the intended purpose. For example, a dispersant which is commercially available as the pigment dispersant can be used and a polymer dispersant having the property of adsorbing on the metal nanowires is particularly preferable. Examples of the polymer dispersant include polyvinyl pyrrolidone, BYK series (BYK Japan KK), Solsperse series (Lubrizol Japan Limited), and AJISPER series (Ajinomoto Co., Inc.).

In cases where a polymer dispersant other than that used to manufacture the metal nanowires is separately added as the dispersant, it should be taken into account that the relevant polymer dispersant is also included in the binder and its content is included in the above-described binder content.

The dispersant content is preferably from 0.1 to 50 parts by weight, more preferably from 0.5 to 40 parts by weight and most preferably from 1 to 30 parts by weight with respect to 100 parts by weight of the binder.

At a dispersant content of 0.1 parts by weight or more, aggregation of the metal nanowires in the dispersion is effectively suppressed, while at a dispersant content of up to 50 parts by weight, a homogeneous liquid film is formed in the coating step and occurrence of uneven coating is suppressed, and hence the dispersant content in the foregoing range is preferable.

[Solvent]

The solvent is an ingredient used to obtain a coating liquid for forming, on a surface of a base, a film of a composition containing the above-described metal nanowires and the photopolymerizable composition, and a suitable solvent can be selected according to the intended purpose. Examples of the solvent include propylene glycol monomethyl ether, propylene glycol monomethyl ether acetate, ethyl 3-ethoxypropionate, methyl 3-methoxypropionate, ethyl lactate, 3-methoxybutanol, water, 1-methoxy-2-propanol, isopropyl acetate, methyl lactate, N-methylpyrrolidone (NMP), γ-butyrolactone (GBL), and propylene carbonate. At least a part of the solvent in the dispersion of the above-described metal nanowires may be used as the solvent for the above purpose. These may be used alone or in combination of two or more.

The coating liquid containing such a solvent preferably contains solids at a solid content concentration ranging from 0.1 to 20 wt %.

[Metal Corrosion Inhibitor]

The photopolymerizable composition preferably contains a metal corrosion inhibitor for the metal nanowires. The metal corrosion inhibitor is not particularly limited but can be appropriately selected according to the intended purpose, and for example, thiols and azoles are suitable.

By incorporating the metal corrosion inhibitor, the photopolymerizable composition can exhibit the rust inhibiting effect and deterioration over time of the electrical conductivity and the transparency of the electrically-conductive materials can be minimized. The metal corrosion inhibitor can be given by adding to a composition for forming a photosensitive layer in such a state that the metal corrosion inhibitor is dissolved in a suitable solvent or in the form of powder, or by forming the conductive film and then immersing the formed conductive film in a bath of the metal corrosion inhibitor.

In cases where the metal corrosion inhibitor is added, it is preferably incorporated in an amount of 0.5 to 10 wt % with respect to the metal nanowires.

In addition, as for the matrix, it is possible to use a polymer compound used as the dispersant in the manufacture of the above-described metal nanowires as at least a part of the ingredients constituting the matrix.

A composition containing at least a sol-gel cured product as a matrix ingredient in addition to the metal nanowires can also be used to form the transparent conductive film.

The sol-gel cured product is described in detail below.

<Sol-Gel Cured Product>

The sol-gel cured product is obtained by subjecting an alkoxide compound of an element selected from the group consisting of Si, Ti, Zr and Al (hereinafter also referred to as "specific alkoxide compound") to hydrolysis and polycondensation, and further heating and drying as desired.

[Specific Alkoxide Compound]

The specific alkoxide compound is preferably a compound represented by general formula (X) shown below in terms of easy availability.

$$M^1(OR^{10})_a R^{11}_{4-a} \qquad (X)$$

(In general formula (X), $M^1$ represents an element selected from Si, Ti and Zr; $R^{10}$ and $R^{11}$ each independently represent a hydrogen atom or a hydrocarbon group; and a represents an integer from 2 to 4).

Each of the hydrocarbon groups represented by $R^{10}$ and $R^{11}$ in general formula (X) is preferably an alkyl group or an aryl group.

When an alkyl group is represented, the number of carbon atoms in the group is preferably from 1 to 18, more preferably from 1 to 8 and even more preferably from 1 to 4. When an aryl group is represented, the aryl group is preferably a phenyl group.

The alkyl or aryl group may have a substituent. Examples of the substituent that can be introduced include halogen atoms, amino groups, alkylamino groups and mercapto groups.

The compound represented by general formula (X) is a low molecular weight compound and preferably has a molecular weight of up to 1,000.

Specific examples of the compound represented by general formula (X) are described in, for example, JP 2010-064474 A.

In cases where a sol-gel cured product is used as the matrix of the conductive film in the invention, the sol-gel cured product is preferably used so that the ratio of the specific alkoxide compound to the above-described metal nanowires, i.e., the weight ratio of the specific alkoxide compound to the metal nanowires is in a range of 0.25/1 to 30/1. At a weight ratio of less than 0.25/1, the conductive film has poor transparency and is inferior in at least one of wear resistance, heat resistance, resistance to moist heat and flex resistance, while at a weight ratio of more than 30/1, the conductive film is inferior in electrical conductivity and flex resistance.

The weight ratio is more preferably in a range of 0.5/1 to 20/1, even more preferably 1/1 to 15/1 and most preferably 2/1 to 8/1 because an electrically-conductive material having high electrical conductivity and high transparency (total light transmittance and haze), having excellent wear resistance, heat resistance and resistance to moist heat, and also having excellent flex resistance can be obtained in a consistent manner.

For the formation of the conductive film, a composition containing at least a polymer can also be used as a matrix ingredient in addition to the metal nanowires.

The polymer that may be used is described below in detail.

Examples of the polymer include synthetic polymers and natural polymers, and exemplary synthetic polymers include polyester, polyimide, polyacryl, polyvinylon, polyethylene, polypropylene, polystyrene, polyvinyl chloride, methacrylate resin, fluororesin, phenol resin, melamine resin, silicone resin, synthetic rubber and latex thereof. Exemplary natural polymers include cellulosic resin and natural rubber.

A protective layer made of a protective coating material may be formed on the conductive film when necessary.

The materials described in, for example, JP 2011-167848 A can be used as the protective coating material for forming the protective layer.

The protective coating material may contain a crosslinking agent, a polymerization initiator, stabilizers (e.g., an antioxidant and an ultraviolet light stabilizer for prolonging the product lifetime, and a polymerization inhibitor for improving the shelf life), a surfactant and an additive having a similar effect. The protective coating material may further contain a corrosion inhibitor for protecting the metal nanowires from corrosion.

The method of forming the protective layer is not particularly limited as long as a known wet coating method is employed. Specific examples of the method include spray coating, bar coating, roll coating, die coating, inkjet coating, screen coating and dip coating.

When the protective layer is formed as the transparent conductive film is impregnated with the coating material for the protective layer, if the thickness of the protective layer after coating and drying is too small with respect to the conductive film before coating, the functions required of the protective layer, such as abrasion resistance, wear resistance and weather resistance, decrease, and if the thickness of the protective layer is too large, the contact resistance of the conductive film as a conductor increases.

When the conductive film formed has a thickness in a range of 50 to 150 nm, the coating material for the protective layer is preferably applied to a film thickness after coating and drying of 30 to 150 nm, and the film thickness can be adjusted in consideration of the thickness of the conductive film so that the surface resistivity and haze may have predetermined values. In particular, the film thickness is more preferably from 40 to 175 nm and most preferably from 50 to 150 nm. Depending on the thickness of the transparent conductive film, the protective functions of the protective layer are likely to work better if the film thickness after drying of the coating material for the protective layer is not less than 30 nm, while a film thickness of 150 nm or less tends to ensure better conductive performance.

The conductive film may be patterned in a desired shape according to the intended use.

The method of patterning the conductive film is not particularly limited and an exemplary method involves subjecting the conductive film to exposure and development. More specifically, the patterning method includes a pattern exposure step and a development step, and further optionally other steps.

When the matrix of the conductive film is not photosensitive, the conductive film is preferably patterned by either of the following methods (1) and (2).

(1) A patterning method which involves forming a photoresist layer on a conductive film; performing desired pattern exposure and development on the photoresist layer to form a resist patterned as desired (etching mask material); and etching the conductive film in its regions unprotected by the resist, using a wet process for treatment with an etching solution capable of etching the conductive film or a dry process such as reactive ion etching, to thereby break or remove the conductive film in the above regions. This method is described in, for example, JP 2010-507199 A (in particular paragraphs [0212] to [0217]).

(2) A patterning method which involves providing a photo-curable resin on desired regions of a conductive film by an inkjet system or a screen printing system so as to form a patterned layer of the resin on the conductive film; subjecting the photo-curable resin layer to desired exposure to form a patterned resist (etching mask material); and then immersing the conductive film in an etching solution capable of etching the conductive film or showering the conductive film with the etching solution to thereby break or remove the conductive film in its regions unprotected by the resist.

In either of the methods (1) and (2), the resist on the conductive film is preferably removed by a common method after the end of patterning.

The process for applying an etching mask material is not particularly limited and examples thereof include a coating process, a printing process and an inkjet process.

The coating process is not particularly limited and examples thereof include roll coating, bar coating, dip coating, spin coating, casting, die coating, blade coating, gravure coating, curtain coating, spray coating, and doctor coating.

Examples of the printing process include relief printing (letterpress printing), stencil printing (screen printing), lithographic printing (offset printing) and intaglio printing (gravure printing). The resist layer formed in this step may be a positive resist layer or a negative resist layer. In the case of a positive resist layer, the regions of the resist layer which are exposed to light in a patterned manner are solubilized and those regions not exposed to light (regions not solubilized) constitute a patterned resist layer. In the case of a negative resist layer, the exposed regions of the resist layer are cured and those regions not exposed to light, that is to say, not cured are removed with a solubilizing solution so as to form a patterned resist layer.

The type of the material for forming the resist layer that may be used in the method (1) is not particularly limited and any of a negative type, a positive type and a dry film type may be used.

A commercially available alkali-soluble photoresist can be appropriately selected and used to form the resist layer. Color Mosaic series, FILS series, FIOS series, FMES series, FTENS series, FIES series, positive and negative photoresist series for use in semiconductor processes from FUJIFILM Corporation; Fuji Resist series and in particular FR series, FPPR series, FMR series and FDER series from Fujiyakuhin Co., Ltd. can be suitably used, and other examples of the photoresist that may be suitably used include photoresist series and in particular RFP series, TFP series, SZP series, HKT series, SFP series, SR series, SOP series, SZC series, CTP series, ANR series, P4000 series, TPM606, 40XT, and nXT series from AZ Electronic Materials Plc. It is also possible to widely use photoresists from JSR Corporation from high-resolution types to low-resolution types.

Examples of the dry film resist include photosensitive films for use in printed circuit boards manufactured by Hitachi Chemical Co., Ltd., photosensitive dry films SUNFORT series manufactured by Asahi Kasei E-materials Corporation, FXG series, FXR series, FX900 series, JSF100 series, SA100 series, LDI series, FRA series and CM series manufactured by DuPont MRC DryFilm Ltd. and Transer series manufactured by FUJIFILM Corporation, and these can be appropriately used.

A suitable material may be selected from these materials for forming the resist layer according to the resolution of a pattern to be formed in the conductive film.

In cases where a dry film type material for forming the resist layer is used in the resist layer formation, a photosensitive resist layer prepared in advance from a dry film resist need only be transferred to a surface of the conductive film formed.

In the exposure step, an etching mask material containing a photopolymerization initiator is used to perform exposure at an oxygen concentration of up to 5%.

A transfer material may be used to form by transfer a patterned conductive film on a target substrate.

It is also possible to pattern a conductive film by applying a remover (an etching solution) in a pattern onto the conductive film through screen printing as described in paragraphs [0147] to [0148] of JP 2011-167848 A.

<Transparent Double-Sided Adhesive Sheet>

The transparent double-sided adhesive sheet is a transparent sheet in which the front surface and the back surface exhibit adhesiveness. This sheet is overlaid on the conductive film so that one surface of the sheet exhibiting adhesiveness is attached to the conductive film. In other words, the transparent double-sided adhesive sheet is attached to the conductive film side of the conductive film-bearing transparent substrate which includes the transparent substrate and the conductive film disposed thereon.

More specifically, in FIG. 4, a front surface 306c and a back surface 306d of the transparent double-sided adhesive sheet 306 exhibit adhesiveness and the transparent double-sided adhesive sheet 306 is disposed on the conductive film 304 so that the surface 306c is attached to the conductive film 304.

The transparent double-sided adhesive sheet has only to have an adhesive layer, and may be of a type having a base, on both surfaces of which adhesive layers are disposed (a transparent double-sided adhesive sheet having a base), or be of a type having no base but comprised only of an adhesive layer (a transparent double-sided adhesive sheet having no base). In particular, a transparent double-sided adhesive sheet having no base is preferable in terms of the thickness reduction of a product using a transparent double-sided adhesive sheet.

The transparent double-sided adhesive sheet contains the above-described SH group-containing compound. The preferred embodiment of the contained SH group-containing compound is as described above.

When the transparent double-sided adhesive sheet is the one having a base, the SH group-containing compound may be contained in either or both of the base and the adhesive layers.

When the above-described SH group-containing compound is contained in the adhesive layer(s) of the double-sided adhesive sheet, a decrease in the adhesive force of the adhesive layer(s) is not seen even when the conductive film laminate is allowed to stand in an environment of high temperature and high humidity because the dispersibility of the compound in the adhesive is more excellent.

The content of the SH group-containing compound in the transparent double-sided adhesive sheet is not particularly limited and is preferably from 0.01 to 10 wt %, more preferably from 0.02 to 6.0 wt %, even more preferably from 0.05 to 5.0 wt % and most preferably from 0.5 to 5.0 wt % with respect to the total weight of the transparent double-sided adhesive sheet. When the content is within the foregoing range, the effect of suppressing ion migration, and the transmittance and the adhesion of the sheet are excellent.

The thickness of the transparent double-sided adhesive sheet is not particularly limited and is preferably from 5 to 150 μm and more preferably from 20 to 100 μm in terms of the application of the conductive film laminate to a touch panel.

The effect obtained by adjusting the thickness of the transparent double-sided adhesive sheet to 20 μm or more is that differences in level or irregularities of the substrate to which the sheet is to be attached can be covered, and the effect obtained by adjusting the adhesive sheet thickness to 100 μm or less is that the transmittance of the transparent double-sided adhesive sheet can be fully ensured.

When the transparent double-sided adhesive sheet is the one having a base, the adhesive layers are provided on both surfaces of the base. Although the type of the base to be used is not particularly limited, a transparent base is preferably used. Examples of the transparent base include a polyethylene terephthalate film, a polybutylene terephthalate film, a polyethylene naphthalate film, a polyethylene film, a polypropylene film, cellophane, a diacetyl cellulose film, a triacetyl cellulose film, an acetyl cellulose butyrate film, a polyvinyl chloride film, a polyvinylidene chloride film, a polyvinyl alcohol film, an ethylene-vinyl acetate copolymer film, a polystyrene film, a polycarbonate film, a polymethylpentene film, a polysulfone film, a polyether ether ketone film, a polyether sulfone film, a polyether imide film, a polyimide film, a fluororesin film, a nylon film and an acrylic resin film.

The material of the adhesive layer(s) of the transparent double-sided adhesive sheet is not particularly limited and a known material may be used. Use may be made of various adhesives, such as a rubber adhesive, an acrylic adhesive, a silicone adhesive and a urethane adhesive, but an acrylic adhesive is preferable in terms of more excellent transparency and more excellent compatibility with the above-described SH group-containing compound.

The acrylic adhesive uses, as a base polymer, an acrylic polymer having an alkyl (meth)acrylate monomer unit in the main backbone. (Meth)acrylate refers to an acrylate and/or a methacrylate. The alkyl group in the alkyl (meth)acrylate which constitutes the main backbone of the acrylic polymer preferably contains on average about 1 to 12 carbon atoms and specific examples of the alkyl (meth)acrylate include methyl (meth)acrylate, ethyl (meth)acrylate, butyl (meth) acrylate and 2-ethylhexyl (meth)acrylate.

The transparent double-sided adhesive sheet immediately after having been allowed to stand under conditions of 60° C. and 90% RH for 100 hours preferably has a total light transmittance of at least 80%, more preferably at least 85% and even more preferably at least 90%, and a haze of up to 1.0% and more preferably up to 0.7%.

The transparent double-sided adhesive sheet immediately after having been allowed to stand under conditions of 60° C. and 90% RH for 100 hours preferably has a water absorption of up to 2.0%, more preferably up to 1.25% and even more preferably up to 1.0%.

The water absorption is measured according to the method described in JP 2012-11637 A.

The transparent double-sided adhesive sheet can be manufactured by a known method. For example, in the case of a transparent double-sided adhesive sheet having no base, the transparent double-sided adhesive sheet may be prepared by applying an adhesive composition containing an SH group-containing compound onto a separator (release liner) to a predetermined dry thickness to thereby form a coating layer of the adhesive composition, then drying and optionally curing the coating layer to form an adhesive layer.

In the case of a transparent double-sided adhesive sheet having a base, adhesive layers may be formed by directly applying an adhesive composition containing an SH group-containing compound onto surfaces of the base and drying the applied composition (direct application) or each adhesive layer may be provided on the base by forming an adhesive layer containing an SH group-containing compound on a separator in the same manner as the above and then transferring (attaching) the adhesive layer to the base (transfer method).

Another exemplary manufacturing method is a method which involves applying an adhesive composition onto surfaces of a base containing an SH group-containing compound to form adhesive layers, thereby manufacturing a transparent double-sided adhesive sheet having the base.

In FIG. 4, the conductive film 304 and the transparent double-sided adhesive sheet 306 are formed on one surface of the transparent substrate 302 but the invention is not limited to this embodiment.

Figure 5:
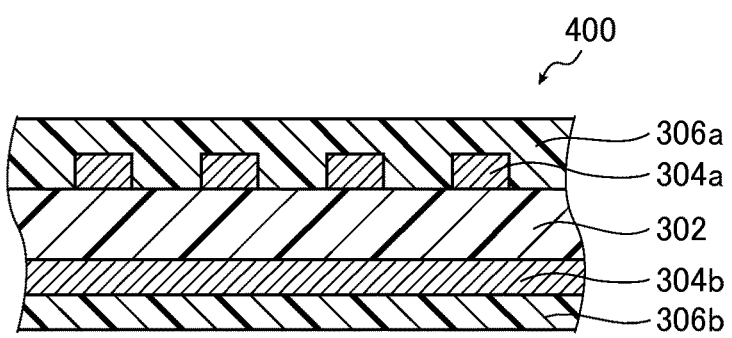
FIG. 5 is a schematic cross-sectional view of another embodiment of the conductive film laminate of the invention.

For example, as in a conductive film laminate 400 shown in FIG. 5, conductive films 304a and 304b, and transparent double-sided adhesive sheets 306a and 306b may be formed on both surfaces of a transparent substrate 302. Two conductive films may be different in pattern shape from each other, as is the case with the conductive films 304a and 304b.

<Conductive Film Laminate>

As described above, the conductive film laminate of the invention includes a transparent substrate, a conductive film containing silver or a silver alloy and disposed on the transparent substrate, and a transparent double-sided adhesive sheet attached onto the conductive film.

When necessary, another member (e.g., a protective substrate to be described later) may be further attached to a bare surface of the transparent double-sided adhesive sheet exhibiting adhesiveness.

The conductive film laminate is widely applied to, for example, a touch panel, a display electrode, an electromagnetic shield, an electrode for an organic or inorganic EL display, electronic paper, an electrode for a flexible display, an integrated solar cell, a display element and various other devices because ion migration between the conductive films can be further suppressed. Of these, a touch panel is particularly preferable. An embodiment of the touch panel is described below in detail.

<Touch Panel>

When the above-described conductive film laminate is used in a touch panel, the touch panel has excellent visibility owing to the high transmittance and also has excellent responsiveness to the screen operation. Ion migration between the conductive films is further suppressed and hence its performance is maintained even after the touch panel is allowed to stand in a severe environment over an extended period of time.

Exemplary touch panels include widely known touch panels and the conductive film laminate of the invention can be applied to touch panels known as so-called touch sensors and touch pads.

The touch panel is not particularly limited in type as long as it is provided with the above-described conductive film laminate and a suitable touch panel can be selected depending on the intended purpose. Examples of the touch panel include a surface capacitive touch panel, a projected capacitive touch panel, and a resistive touch panel.

A preferred embodiment of the touch panel is described below in detail with reference to the drawings.

Figure 6A:
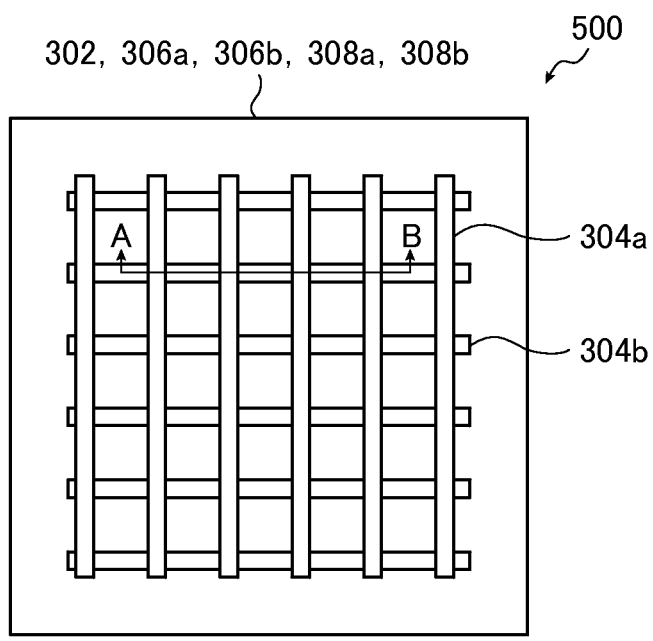
FIG. 6A is a schematic top view of an embodiment of a touch panel of the invention.
Figure 6B:
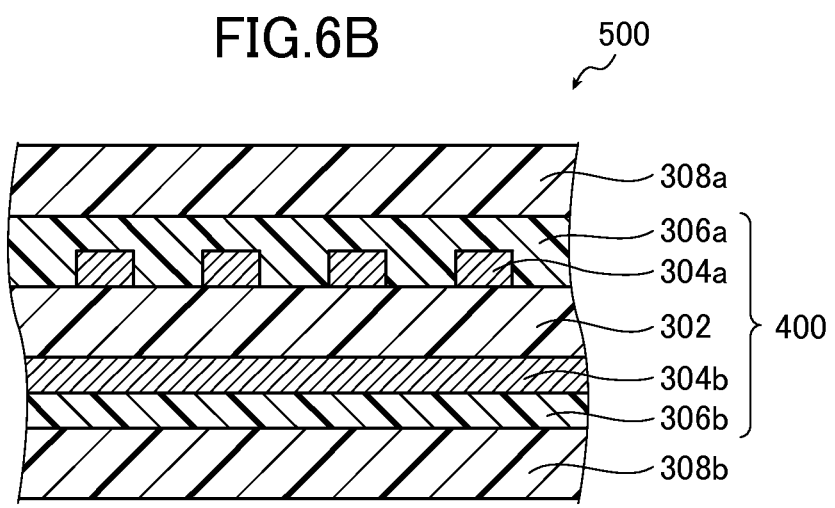
FIG. 6B is a schematic cross-sectional view taken along line A-B in FIG. 6A.

FIGS. 6A and 6B show an embodiment of a touch panel including the above-described conductive film laminate. A touch panel 500 in FIGS. 6A and 6B is a so-called projected capacitive touch panel and corresponds to a system including transparent electrodes on both surfaces of a base.

In the touch panel 500, a conductive film 304a is first provided on one surface of a transparent substrate 302, a transparent double-sided adhesive sheet 306a is attached onto the conductive film 304a, and a protective substrate 308a is further attached onto an adhesive surface of the transparent double-sided adhesive sheet 306a. On the other surface of the transparent substrate 302, a conductive film 304b, a transparent double-sided adhesive sheet 306b and a protective substrate 308b are disposed in this order in the same manner as on the opposite surface. In other words, the touch panel 500 corresponds to the embodiment in which the protective substrates 308a and 308b are attached to the surfaces of the transparent double-sided adhesive sheets 306a and 306b of the conductive film laminate 400.

The conductive films 304a and 304b are electrically connected to an external detection circuit (not shown) via electrode terminals (not shown).

FIG. 6A is a schematic plan view of the touch panel 500 and the conductive films 304a and 304b each have a pattern shape of lines arranged at equal intervals. The conductive films 304a and 304b are disposed so that their patterns are substantially orthogonal to each other.

When the protective substrate 308a is touched with a finger or the like in the touch panel 500, a change in the capacitance value occurs between the finger or the like and the conductive film 304a or 304b. The external detection circuit detects the change in the capacitance value to specify the coordinates of the touched point.

The touch panel 500 shown in FIGS. 6A and 6B has the same configuration as the conductive film laminate 400 shown in FIG. 5 except that the former has the protective substrates 308a and 308b. Accordingly, like elements are denoted by the same reference signs and their description is omitted. The following description mainly focuses on the protective substrates 308a and 308b.

The material of the protective substrates is not particularly limited and examples thereof include (meth)acrylic resin, polycarbonate resin, glass and polyethylene terephthalate resin. Of these, (meth)acrylic resin which has excellent transparency and is light in weight is preferable.

FIGS. 6A and 6B show a linear pattern of the conductive films 304a and 304b but the geometry of the conductive films 304a and 304b is not limited to this embodiment but a known embodiment may be applied.

The touch panel 500 in FIGS. 6A and 6B corresponds to a system including transparent electrodes on both surfaces of a base but the configuration is not limited to this.

Figure 7:
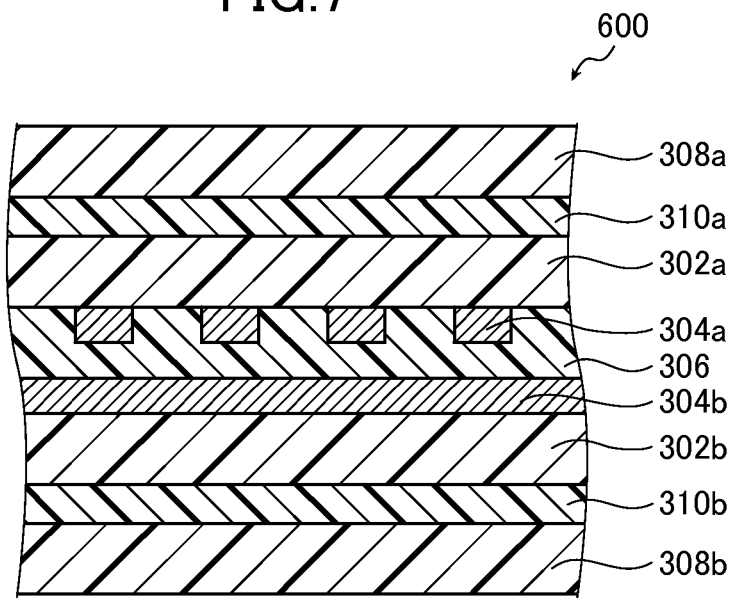
FIG. 7 is a schematic cross-sectional view of another embodiment of the touch panel of the invention.

For example, the touch panel may be of an attachment type as shown in FIG. 7 and obtained by preparing two conductive film-bearing transparent substrates and attaching the substrates so that the conductive films face each other via a transparent double-sided adhesive sheet. In a touch panel 600 of FIG. 7, a transparent substrate 302a having a conductive film 304a formed on a surface thereof is attached to one surface of a transparent double-sided adhesive sheet 306 and a protective substrate 308a is formed on the transparent substrate 302a via an adhesive layer 310a. On the other surface of the transparent double-sided adhesive sheet 306, a conductive film 304b, a transparent substrate 302b, an adhesive layer 310b and a protective substrate 308b are disposed in this order in the same manner as on the opposite surface.

The conductive films 304a and 304b are electrically connected to an external detection circuit (not shown) via electrode terminals (not shown).

When the protective substrate 308a is touched with a finger or the like in the touch panel 600, a change in the capacitance value occurs between the finger or the like and the conductive film 304a or 304b. The external detection circuit detects the change in the capacitance value to specify the coordinates of the touched point.

Known materials may be used as the materials of the adhesive layers 310a and 310b and illustrative examples thereof include a thermosetting epoxy resin and a photo-curable acrylate resin.

Known adhesive layers may be used instead of the adhesive layers 310a and 310b.

Figure 8:
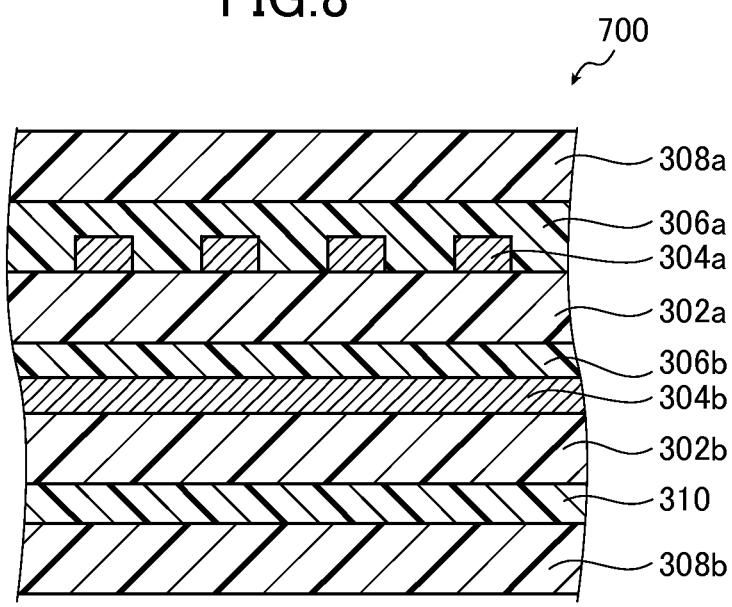
FIG. 8 is a schematic cross-sectional view of still another embodiment of the touch panel of the invention.

As shown in FIG. 8, the touch panel may be obtained by an attachment process different from the process shown in FIG. 7. In a touch panel 700 of FIG. 8, a conductive film 304a is first provided on one surface of a transparent substrate 302a, and a protective substrate 308a is further attached via a transparent double-sided adhesive sheet 306a. A transparent substrate 302b having a conductive film 304b disposed on a surface thereof is attached onto the other surface of the transparent substrate 302a via a transparent double-sided adhesive sheet 306b, and a protective substrate 308b is further attached to the transparent substrate 302b via an adhesive layer 310.

EXAMPLES

The invention is described below in further detail by way of examples. However, the invention should not be construed as being limited to the following examples.

Example 1

A metal interconnect-bearing insulating substrate provided with silver interconnects (L/S=200 μm/200 μm) was fabricated by screen printing using a copper-clad laminate (MCL-E-679F manufactured by Hitachi Chemical Co., Ltd.; substrate: glass epoxy substrate). The metal interconnect-bearing insulating substrate was fabricated by the method described below.

Copper foil was peeled from the copper-clad laminate by etching and conductive silver paste (FA-451 manufactured by Fujikurakasei Co., Ltd.) was patterned on the substrate through a metal mask using a screen printer.

Then, the substrate was heated under a condition of 150° C. for 30 minutes to cure the silver interconnects, thereby obtaining the comb-shaped silver circuit board (metal interconnect-bearing insulating substrate) (L/S=200 μm/200 μm).

Next, a composition for forming a silver ion diffusion-suppressing layer which contained a compound A-1, methyl propylene glycol acetate and a methacrylate-acrylate copolymer (acrylic resin) was applied onto the resulting metal interconnect-bearing insulating substrate. Thereafter, the metal interconnect-bearing insulating substrate was heated at 100° C. for 30 minutes and was further heated at 130° C. for 60 minutes to obtain a circuit board.

The contents of the compound A-1 and the insulating resin in the composition for forming the silver ion diffusion-suppressing layer were 0.33 wt % and 33 wt % with respect to the total amount of the composition, respectively.

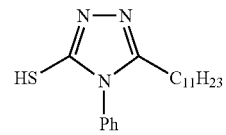

Compound A-1

The service life of the resulting circuit board was measured as described below.

(Evaluation Method (Measurement of Service Life-Prolonging Effect) (Hereinafter Also Referred as "HAST Test"))

The resulting circuit board was used to measure the service life (device used: EHS-221MD manufactured by ESPEC CORP.) under the following conditions: humidity: 85%; temperature: 130° C.; pressure: 1.2 atm; voltage: 100 V.

In the evaluation method, first of all, a comparative circuit board obtained by forming a resin layer only excluding the compound A-1 used in Example 1 on the metal interconnect-bearing insulating substrate was used to measure the service life under the above-described conditions. The time X that had elapsed before the resistance value between silver interconnects reached $1 \times 10^5 \Omega$ was measured.

Then, the circuit board obtained in Example 1 which had the silver ion diffusion-suppressing layer was used to measure the service life under the above-described conditions. The time Y that had elapsed before the resistance value between the silver interconnects reached $1 \times 10^5 \Omega$ was measured.

The resulting time X and time Y were used to calculate the service life-improving effect (Y/X).

The results of the circuit board obtained in Example 1 are shown in Table 1.

Example 2

A circuit board was fabricated and subjected to the above-described HAST test according to the same procedure as in Example 1 except that the compound A-1 in Example 1 was replaced by a compound A-2. The results are shown in Table 1.

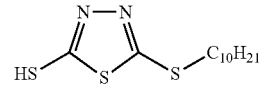

Compound A-2

Example 3

A circuit board was fabricated and subjected to the above-described HAST test according to the same procedure as in Example 1 except that the compound A-1 in Example 1 was replaced by a compound A-3. The results are shown in Table 1.

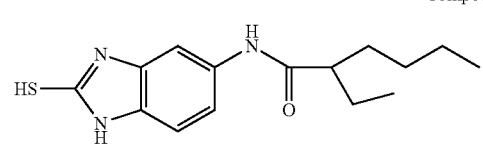

Compound A-3

Example 4

A circuit board was fabricated and subjected to the above-described HAST test according to the same procedure as in Example 1 except that the compound A-1 in Example 1 was replaced by a compound A-4. The results are shown in Table 1.

Compound A-4

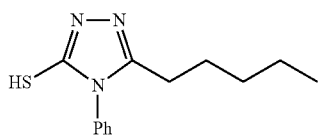

Example 5

A circuit board was fabricated and subjected to the above-described HAST test according to the same procedure as in Example 1 except that the compound A-1 in Example 1 was replaced by a compound A-5. The results are shown in Table 1.

Compound A-5

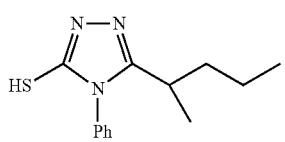

Example 6

A circuit board was fabricated and subjected to the above-described HAST test according to the same procedure as in Example 1 except that the compound A-1 in Example 1 was replaced by a compound A-6. The results are shown in Table 1.

Compound A-6

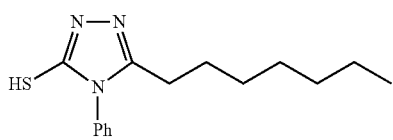

Example 7

A circuit board was fabricated and subjected to the above-described HAST test according to the same procedure as in Example 1 except that the compound A-1 in Example 1 was replaced by a compound A-7. The results are shown in Table 1.

Compound A-7

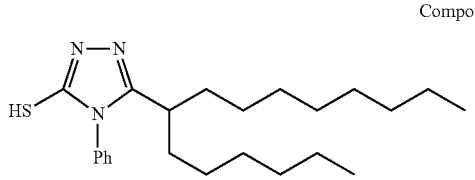

Example 8

A circuit board was fabricated and subjected to the above-described HAST test according to the same procedure as in Example 1 except that the compound A-1 (0.33 wt % with respect to the total amount of the composition) in Example 1 was replaced by a compound A-8 (0.66 wt % with respect to the total amount of the composition). The results are shown in Table 1.

Compound A-8

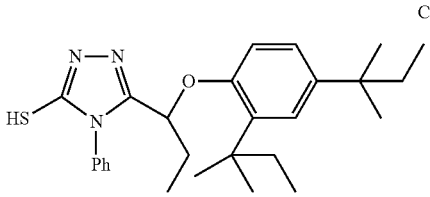

Example 9

A circuit board was fabricated and subjected to the above-described HAST test according to the same procedure as in Example 1 except that the compound A-1 in Example 1 was replaced by a compound A-9. The results are shown in Table 1.

Compound A-9

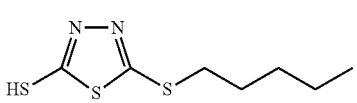

Example 10

A circuit board was fabricated and subjected to the above-described HAST test according to the same procedure as in Example 1 except that the compound A-1 in Example 1 was replaced by a compound A-10. The results are shown in Table 1.

Compound A-10

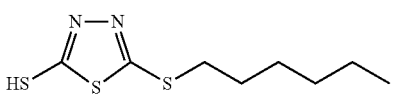

Example 11

A circuit board was fabricated and subjected to the above-described HAST test according to the same procedure as in Example 1 except that the compound A-1 in Example 1 was replaced by a compound A-11. The results are shown in Table 1.

Compound A-11

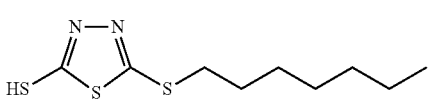

Example 12

A circuit board was fabricated and subjected to the above-described HAST test according to the same procedure as in Example 1 except that the compound A-1 in Example 1 was replaced by a compound A-12. The results are shown in Table 1.

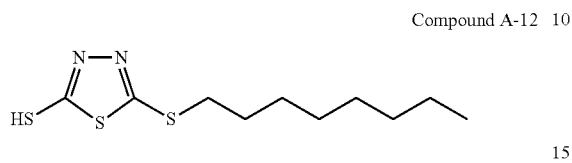

Compound A-12

Example 13

A circuit board was fabricated and subjected to the above-described HAST test according to the same procedure as in Example 1 except that the compound A-1 in Example 1 was replaced by a compound A-13. The results are shown in Table 1.

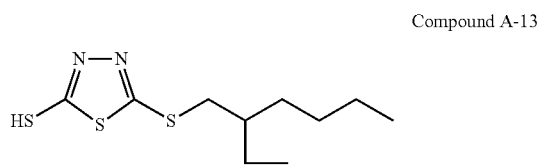

Compound A-13

Example 14

A circuit board was fabricated and subjected to the above-described HAST test according to the same procedure as in Example 1 except that the compound A-1 in Example 1 was replaced by a compound A-14. The results are shown in Table 1.

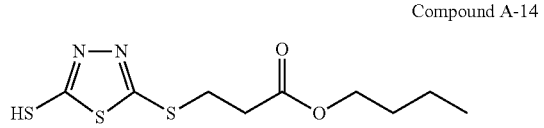 [SMILES: CCCCOC(=O)CCSc1nnc(S)s1]

Compound A-14

Example 15

A circuit board was fabricated and subjected to the above-described HAST test according to the same procedure as in Example 1 except that the compound A-1 in Example 1 was replaced by a compound A-15. The results are shown in Table 1.

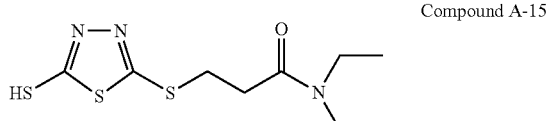

Compound A-15

Comparative Example 1

A circuit board was fabricated and subjected to the above-described HAST test according to the same procedure as in Example 1 except that the compound A-1 in Example 1 was replaced by a compound R-1. The results are shown in Table 1.

Compound R-1

Comparative Example 2

A circuit board was fabricated and subjected to the above-described HAST test according to the same procedure as in Example 1 except that the compound A-1 in Example 1 was replaced by a compound R-2. The results are shown in Table 1.

Compound R-2

Comparative Example 3

A circuit board was fabricated and subjected to the above-described HAST test according to the same procedure as in Example 1 except that the compound A-1 in Example 1 was replaced by a compound R-3. The results are shown in Table 1.

Compound R-3

Comparative Example 4

A circuit board was fabricated and subjected to the above-described HAST test according to the same procedure as in Example 1 except that the compound A-1 in Example 1 was replaced by a compound R-4. The results are shown in Table 1.

Compound R-4

Comparative Example 5

Instead of forming a silver ion diffusion-suppressing layer on the metal interconnect-bearing insulating substrate used in Example 1, an insulating layer (PFR-800 manufactured by Taiyo Ink Mfg. Co., Ltd.) was laminated on a surface of the substrate on the metal interconnect side, then exposure to light and baking were conducted to fabricate an insulating layer-bearing circuit board (thickness of the insulating layer: 35 μm), which was subjected to the above-described HAST test. The results are shown in Table 1.

TABLE 1

| | Compound | Insulating resin | Presence of tertiary or quaternary carbon atom | Service life-prolonging effect |
|---|---|---|---|---|
| Example 1 | A-1 | Acrylate-methacrylate copolymer | No | 1.8 |
| Example 2 | A-2 | Acrylate-methacrylate copolymer | No | 1.6 |
| Example 3 | A-3 | Acrylate-methacrylate copolymer | Yes | 1.6 |
| Example 4 | A-4 | Acrylate-methacrylate copolymer | No | 2.0 |
| Example 5 | A-5 | Acrylate-methacrylate copolymer | Yes | 2.4 |
| Example 6 | A-6 | Acrylate-methacrylate copolymer | No | 2.0 |
| Example 7 | A-7 | Acrylate-methacrylate copolymer | Yes | 2.5 |
| Example 8 | A-8 | Acrylate-methacrylate copolymer | Yes | 2.7 |
| Example 9 | A-9 | Acrylate-methacrylate copolymer | No | 1.9 |
| Example 10 | A-10 | Acrylate-methacrylate copolymer | No | 1.8 |
| Example 11 | A-11 | Acrylate-methacrylate copolymer | No | 1.8 |
| Example 12 | A-12 | Acrylate-methacrylate copolymer | No | 1.8 |
| Example 13 | A-13 | Acrylate-methacrylate copolymer | Yes | 2.0 |
| Example 14 | A-14 | Acrylate-methacrylate copolymer | No | 2.0 |
| Example 15 | A-15 | Acrylate-methacrylate copolymer | No | 2.0 |
| Comparative Example 1 | R-1 | Acrylate-methacrylate copolymer | No | 0.8 |
| Comparative Example 2 | R-2 | Acrylate-methacrylate copolymer | No | NoData |
| Comparative Example 3 | R-3 | Acrylate-methacrylate copolymer | No | NoData |
| Comparative Example 4 | R-4 | Acrylate-methacrylate copolymer | No | NoData |
| Comparative Example 5 | None | Solder resist | — | 1.1 |

In Table 1, "NoData" refers to a state recognized as "conduction error" in an evaluation tester for detecting occurrence of migration due to resin breakage that occurred in the heating and humidifying step in a thermostatic oven before current application during the HAST test.

As shown in Table 1, use of the silver ion diffusion-suppressing layer containing the SH group-containing compound and obtained from the composition of the invention shows a significant service life-prolonging effect, which confirmed that ion migration was further suppressed.

More excellent service life-prolonging effect was confirmed particularly in Example 1 which used the compound represented by formula (1).

From the comparisons between Examples 1 and 4 to 8 and the comparisons between Examples 2 and 9 to 13, more excellent service life-prolonging effect was confirmed in Examples 5, 7, 8 and 13 in which the hydrocarbon groups are ones containing a tertiary and/or quaternary carbon atom. Even more excellent service life-prolonging effect was confirmed particularly in Example 8 in which the hydrocarbon group is a group containing a plurality of tertiary and/or quaternary carbon atoms.

From the comparisons between Examples 2 and 9 to 12 and Examples 14 and 15, more excellent service life-prolonging effect was confirmed in Example 14 in which the hydrocarbon group is one containing a group represented by formula (B-1) shown above and in Example 15 in which the hydrocarbon group is one containing a group represented by formula (B-3) shown above.

On the other hand, a desired effect could not be obtained in Comparative Examples 1 to 4 which used the compositions containing no predetermined compound. In Comparative Example 5 which used solder resist, a slight service life-prolonging effect was seen but the effect was inferior in comparison with Examples.

(Preparation of Aqueous Dispersion of Silver Nanowires)
—Preparation of Silver Nanowire Dispersion (1)—

Silver nitrate powder (60 g) was dissolved in propylene glycol (370 g) to prepare a silver nitrate solution 101. Polyvinyl pyrrolidone (molecular weight: 55,000; 72.0 g) was added to propylene glycol (4.45 kg) and the mixture was heated to 90° C. while purging the gas phase portion in a vessel with nitrogen gas. This solution was named "reaction solution 101." While the gas phase portion was kept purged with nitrogen gas, the silver nitrate solution 101 (2.50 g) was added to the reaction solution 101 which was vigorously being stirred, and the solution thus obtained was heated with stirring for 1 minute. To the solution was further added a solution of tetrabutylammonium chloride (11.8 g) in propylene glycol (100 g) and the resulting solution was named "reaction solution 102."

To the reaction solution 102 which was kept at 90° C. and stirred at a stirring rate of 500 rpm, was added the silver nitrate solution 101 (200 g) at an addition rate of 50 cc/min. The stirring rate was reduced to 100 rpm, purging with nitrogen gas was stopped and the solution was heated with stirring for 15 hours. To the solution which was kept at 90° C. and stirred at a stirring rate of 100 rpm, was added the silver nitrate solution 101 (220 g) at an addition rate of 0.5 cc/min and the solution was kept heated and stirred for 2 hours from the end of the addition. After the stirring rate was changed to 500 rpm and distilled water (1.0 kg) was added, the solution was cooled to 25° C. to prepare a charge solution 101.

An ultrafiltration module having a molecular weight cut-off of 150,000 was used to perform ultrafiltration as described below. Addition of a mixed solution of distilled water and 1-propanol (volume ratio: 1/1) to the charge solution 101 and concentration of the charge solution 101 were repeated until the filtrate finally had an electrical conductivity of up to 50 μS/cm. Concentration was performed to obtain a silver nanowire dispersion (1) having a metal content of 0.45%.

The average short axis length and the average long axis length of the silver nanowires in the resulting silver nanowire dispersion (1) were measured as described above.

As a result, the average short axis length and the average long axis length were 28.5 nm and 15.2 μm, respectively. In the following description, when referred to as "silver nanowire dispersion (1)," the dispersion represents the silver nanowire dispersion obtained by the above-described method.

—Preparation of Silver Nanowire Dispersion (2)—

Addition solutions A, B, C and D as described below were prepared in advance.

[Addition Solution A]

Stearyltrimethylammonium chloride (55 mg), 10% aqueous solution of stearyltrimethylammonium hydroxide (5.5 g) and glucose (1.8 g) were dissolved in distilled water (115.0 g) to obtain a reaction solution A-1. Silver nitrate powder (65 mg) was further dissolved in distilled water (1.8 g) to obtain a silver nitrate aqueous solution A-1. The silver nitrate aqueous solution A-1 was added to the reaction solution A-1 which was kept at 25° C. and stirred vigorously. The solution was vigorously stirred for 180 minutes from the end of the addition of the silver nitrate aqueous solution A-1 to obtain the addition solution A.

[Addition Solution B]

Silver nitrate powder (42.0 g) was dissolved in distilled water (958 g).

[Addition Solution C]

Twenty-five % ammonia water (75 g) was mixed with distilled water (925 g).

[Addition Solution D]

Polyvinyl pyrrolidone (K30; 400 g) was dissolved in distilled water (1.6 kg).

Next, a silver nanowire dispersion (2) was prepared as described below.

Stearyltrimethylammonium bromide powder (1.30 g), sodium bromide powder (33.1 g), glucose powder (1,000 g) and nitric acid (1 N; 115.0 g) were dissolved in distilled water (12.7 kg) at 80° C. To the solution kept at 80° C. with stirring at 500 rpm were sequentially added the addition solutions A, B and C at addition rates of 250 cc/min, 500 cc/min and 500 cc/min, respectively. The mixture was heated at 80° C. at a stirring rate of 200 rpm. The mixture was heated with stirring at a stirring rate of 200 rpm for 100 minutes and was then cooled to 25° C. The stirring rate was changed to 500 rpm and the addition solution D was added at 500 cc/min. This solution was named "charge solution 201." Next, to vigorously stirred 1-propanol was added the charge solution 201 at a time so that the mixing ratio was 1/1 in terms of volume ratio. The mixture was stirred for 3 minutes to obtain a charge solution 202.

An ultrafiltration module having a molecular weight cut-off of 150,000 was used to perform ultrafiltration as described below.

After the charge solution 202 was concentrated fourfold, addition of a mixed solution of distilled water and 1-propanol (volume ratio: 1/1) and subsequent concentration were repeated until the filtrate finally had an electrical conductivity of up to 50 μS/cm. Concentration was performed to obtain the silver nanowire dispersion (2) having a metal content of 0.45%.

The average short axis length and the average long axis length of the silver nanowires in the resulting silver nanowire dispersion (2) were measured as described above.

As a result, the average short axis length and the average long axis length were 17.2 nm and 8.8 μm, respectively.

Example 16

Fabrication of Conductive Film-Bearing Transparent Substrate

A transparent substrate composed of a PET substrate with a thickness of 125 μm was prepared and a silver-containing conductive film having a comb-shaped electrode pattern (L/S=200 μm/200 μm) was formed on the transparent substrate according to the following procedure to obtain a conductive film laminate.

(Preparation of Conductive Film)

It was confirmed that an alkoxide compound solution having the composition shown below was uniform after stirring at 60° C. for 1 hour. The (polystyrene-equivalent) weight-average molecular weight (Mw) of the resulting sol-gel solution was measured by GPC and the sol-gel solution had an Mw of 4,400. The sol-gel solution (2.24 parts) and the silver nanowire dispersion (1) (17.76 parts) prepared above were mixed together and the mixture was further diluted with distilled water and 1-propanol to obtain a silver nanowire coating solution (1). The solvent ratio between distilled water and 1-propanol in the resulting coating solution was 60:40. The silver nanowire coating solution (1) was applied by bar coating onto the PET substrate with a thickness of 125 μm so that the amount of silver was 0.015 g/m$^2$ and the amount of all solids applied was 0.120 g/m$^2$, and then dried at 120° C. for 1 minute to form a conductive film 1 containing silver nanowires.

(Solution of Alkoxide Compound)

| | |
|---|---|
| Tetraethoxysilane | 5.0 parts |
| (KBE-04 manufactured by Shin-Etsu Chemical Co., Ltd.) | |
| One percent aqueous solution of acetic acid | 11.0 parts |
| Distilled water | 4.0 parts |

(Patterning of Conductive Film)

A photoresist (TMSMR-8900LB manufactured by Tokyo Ohka Kogyo Co., Ltd.) was applied by spin coating onto the conductive film 1 and baked at 90° C. for 60 seconds. Next, the photoresist was subjected to pattern exposure using a photomask (amount of exposure: 12 mW/cm$^2$, 20 seconds), developed with a developer (NMD-W manufactured by Tokyo Ohka Kogyo Co., Ltd.), rinsed with water, dried, and thereafter baked at 120° C. for 60 seconds to form a patterned photoresist on the conductive film 1.

Next, the conductive film was immersed in a silver etching solution (SEA-2 manufactured by Kanto Chemical Co., Inc.) for 30 seconds and then rinsed with water and dried to etch silver nanowires to thereby form non-conductive portions in the conductive film 1. Thereafter, a neutral stripper (PK-SFR8120 manufactured by Parker Corporation, Inc.) was used to peel off the photoresist. The conductive film was then rinsed with water and dried to prepare a patterned conductive film 1 having a comb-shaped electrode pattern (L/S=200 μm/200 μm).

(Fabrication of Transparent Double-Sided Adhesive Sheet)

Next, in a reaction vessel equipped with a stirrer for preparing acrylic copolymers, a reflux condenser, a thermometer, a dropping funnel and a nitrogen gas inlet, n-butyl acrylate (91.5 parts by weight), 2-hydroxyethyl acrylate (0.5 parts by weight), acrylic acid (8.0 parts by weight) and 2,2'-azobisisobutyronitrile (0.2 parts by weight) serving as a polymerization initiator were dissolved in ethyl acetate (100 parts by weight). After purging with nitrogen, the solution was polymerized at 80° C. for 8 hours to obtain an acrylic copolymer (1) having a weight-average molecular weight of 800,000.

Next, the acrylic copolymer (1) (99.1 parts by weight) and the compound A-1 (1.0 parts by weight) were diluted with ethyl acetate to obtain an adhesive composition having a resin solid content of 30%.

To the adhesive composition (100 parts by weight) was added an isocyanate crosslinking agent (0.7 parts by weight; Coronate L-45 manufactured by Nippon Polyurethane Industry Co., Ltd.; solid content: 45%). The resultant mixture was stirred for 15 minutes, then applied onto a polyester film with a thickness of 50 µm, one surface of which had been subjected to releasing treatment with a silicone compound (this film being hereinafter referred to as "#75 release film"), so that an adhesive layer formed on the film had a thickness of 25 µm after drying, and dried at 75° C. for 5 minutes. The adhesive sheet thus obtained and a polyester film with a thickness of 38 µm, one surface of which had been subjected to releasing treatment with a silicone compound (this film being hereinafter referred to as "#38 release film"), were attached together. After aging at 23° C. for 5 days, a transparent double-sided adhesive sheet (adhesive sheet having no base) with a thickness of 25 µm was obtained. The adhesive sheet had a total light transmittance of 90.8%, a haze of 0.6% and a water absorption of 1.24%. The total light transmittance, the haze and the water absorption were measured according to the methods described in JP 2012-11637 A. More specifically, the measurement was performed by the methods described below.

It should be noted that the content of the compound A-1 in the transparent double-sided adhesive sheet was 1.0 wt % with respect to the total weight of the transparent double-sided adhesive sheet.

(Measurement of Total Light Transmittance and Haze in Transparent Double-Sided Adhesive Sheet)

The transparent double-sided adhesive sheet was allowed to stand under conditions of 60° C. and 90% RH for 100 hours, then a PET film and glass were attached to the adhesive sheet in this order to prepare a test sample. An instrument "HR-100" manufactured by Murakami Color Research Laboratory was used to measure the total light transmittance and the haze (%) of the prepared sample.

(Measurement of Water Absorption of Transparent Double-Sided Adhesive Sheet)

Immediately after a transparent double-sided adhesive sheet with a size of 100 mm×100 mm was allowed to stand under conditions of 60° C. and 90% RH for 100 hours, a release film on one surface of the transparent double-sided adhesive sheet was peeled off and the adhesive sheet was attached to a previously weighed aluminum foil sheet with a size of 150 mm×150 mm. A release film on the other side of the adhesive sheet was also peeled off before the adhesive sheet having the aluminum foil sheet attached thereto was weighed (the weight obtained by subtracting the weight of the aluminum foil sheet from the weight thus found being denoted by W1). The adhesive sheet having the aluminum foil sheet attached thereto was dried at 105° C. for 2 hours and weighed (the weight obtained by subtracting the weight of the aluminum foil sheet from the weight thus found being denoted by W2). The water absorption of the double-sided adhesive sheet was calculated by the following equation:

Water absorption of double-sided adhesive sheet (%)=($W1-W2$)/$W2$×100

(Fabrication of Conductive Film Laminate)

One surface of the above-described transparent double-sided adhesive sheet exhibiting adhesiveness was attached onto a transparent substrate having a conductive film formed thereon, thereby obtaining a conductive film laminate. A PET film with a thickness of 50 µm was attached onto the other surface of the transparent double-sided adhesive sheet which was bare and exhibited adhesiveness in the resulting conductive film laminate. Then, the resulting conductive film laminate was treated in an autoclave under conditions of 45° C. and 0.5 MPa for 20 minutes.

Figure 9A:
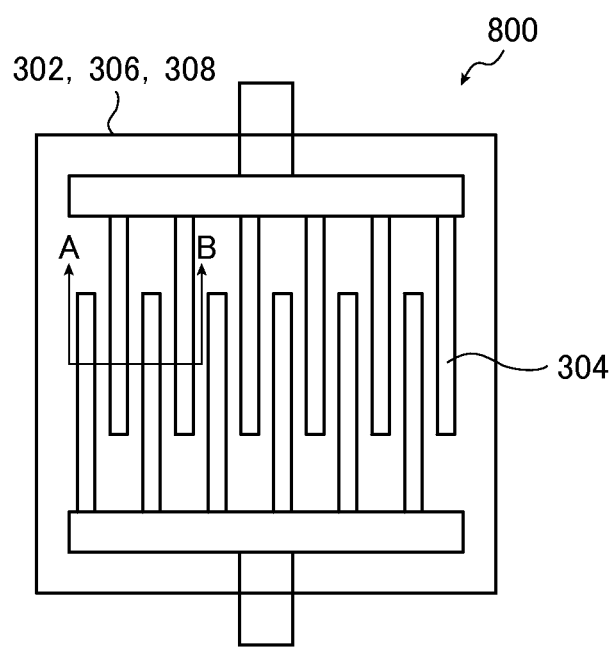
FIG. 9A is a schematic top view of a conductive film laminate used in Examples.
Figure 9B:
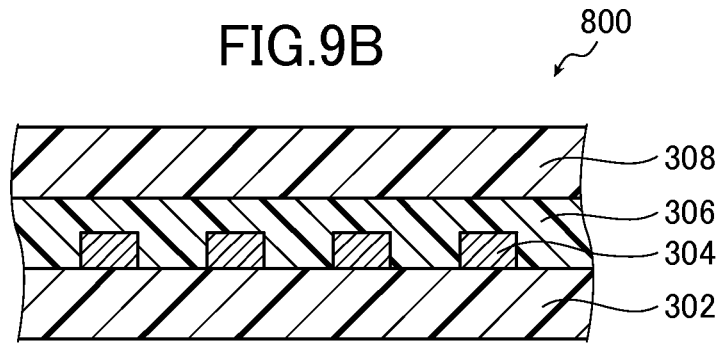
FIG. 9B is a schematic cross-sectional view taken along line A-B in FIG. 9A.

FIG. 9A shows a schematic plan view of a conductive film laminate 800 obtained above and FIG. 9B shows a schematic cross-sectional view taken along line A-B in FIG. 9A. In FIGS. 9A and 9B, the conductive film laminate 800 includes a transparent substrate 302, a conductive film 304, a transparent double-sided adhesive sheet 306 and a protective substrate 308 formed in this order.

Example 17

A conductive film laminate was fabricated according to the same procedure as in Example 16 except that the compound A-1 in Example 16 was replaced by the compound A-2. The transparent double-sided adhesive sheet had a total light transmittance of 90.7%, a haze of 0.6% and a water absorption of 1.24%.

Example 18

A conductive film laminate was fabricated according to the same procedure as in Example 16 except that the compound A-1 in Example 16 was replaced by the compound A-3. The transparent double-sided adhesive sheet had a total light transmittance of 90.8%, a haze of 0.5% and a water absorption of 1.26%.

Example 19

A conductive film laminate was fabricated according to the same procedure as in Example 16 except that the compound A-1 in Example 16 was replaced by the compound A-5. The transparent double-sided adhesive sheet had a total light transmittance of 90.8%, a haze of 0.6% and a water absorption of 1.24%.

Example 20

A conductive film laminate was fabricated according to the same procedure as in Example 16 except that the compound A-1 in Example 16 (1.0 parts by weight) was replaced by the compound A-8 (2.0 parts by weight). The transparent double-sided adhesive sheet had a total light transmittance of 91.0%, a haze of 0.5% and a water absorption of 1.23%.

The content of the compound A-8 in the transparent double-sided adhesive sheet was 2.0 wt % with respect to the total weight of the transparent double-sided adhesive sheet.

Example 21

A conductive film laminate was fabricated according to the same procedure as in Example 16 except that the compound A-1 in Example 16 was replaced by the compound A-9. The transparent double-sided adhesive sheet had a total light transmittance of 90.7%, a haze of 0.4% and a water absorption of 1.20%.

Example 22

A conductive film laminate was fabricated according to the same procedure as in Example 16 except that the compound A-1 in Example 16 was replaced by the compound A-13. The transparent double-sided adhesive sheet had a total light transmittance of 90.9%, a haze of 0.5% and a water absorption of 1.21%.

Example 23

A conductive film laminate was fabricated according to the same procedure as in Example 16 except that the compound A-1 in Example 16 was replaced by the compound A-14. The transparent double-sided adhesive sheet had a total light transmittance of 91.0%, a haze of 0.6% and a water absorption of 1.22%.

Example 24

A conductive film laminate was fabricated according to the same procedure as in Example 16 except that the content of the compound A-1 in the transparent double-sided adhesive sheet was changed from 1.0 wt % in Example 16 to 0.4 wt %. The transparent double-sided adhesive sheet had a total light transmittance of 91.0%, a haze of 0.5% and a water absorption of 1.22%.

Example 25

A conductive film laminate was fabricated according to the same procedure as in Example 16 except that the content of the compound A-1 in the transparent double-sided adhesive sheet was changed from 1.0 wt % in Example 16 to 2.5 wt %. The transparent double-sided adhesive sheet had a total light transmittance of 88.6%, a haze of 0.7% and a water absorption of 1.25%.

Example 26

A conductive film laminate was fabricated according to the same procedure as in Example 16 except that the content of the compound A-1 in the transparent double-sided adhesive sheet was changed from 1.0 wt % in Example 16 to 5.0 wt %. The transparent double-sided adhesive sheet had a total light transmittance of 84.3%, a haze of 0.9% and a water absorption of 1.23%.

Comparative Example 6

A conductive film laminate was fabricated according to the same procedure as in Example 16 except that the compound A-1 in Example 16 was not used. The transparent double-sided adhesive sheet had a total light transmittance of 91.2%, a haze of 0.5% and a water absorption of 1.21%. In this embodiment, the transparent double-sided adhesive sheet did not contain any predetermined compounds.

Comparative Example 7

A conductive film laminate was fabricated according to the same procedure as in Example 16 except that the compound A-1 in Example 16 was replaced by the compound R-1. The transparent double-sided adhesive sheet had a total light transmittance of 89.2%, a haze of 0.8% and a water absorption of 1.25%.

Comparative Example 8

A conductive film laminate was fabricated according to the same procedure as in Example 16 except that the compound A-1 in Example 16 was replaced by the compound R-2. The transparent double-sided adhesive sheet had a total light transmittance of 88.6%, a haze of 0.8% and a water absorption of 1.23%.

Comparative Example 9

A conductive film laminate was fabricated according to the same procedure as in Example 16 except that the compound A-1 in Example 16 was replaced by the compound R-3. The transparent double-sided adhesive sheet had a total light transmittance of 88.8%, a haze of 0.8% and a water absorption of 1.27%.

Comparative Example 10

A conductive film laminate was fabricated according to the same procedure as in Example 16 except that the compound A-1 in Example 16 was replaced by the compound R-4. The transparent double-sided adhesive sheet had a total light transmittance of 86.8%, a haze of 0.9% and a water absorption of 1.29%.

(Evaluation Method (Measurement of Service Life-Prolonging Effect))

The resulting conductive film laminates were used to measure the service life (device used: EHS-221MD manufactured by ESPEC CORP.) under the following conditions: humidity: 90%; temperature: 60° C.; voltage: 10 V.

In the evaluation method, first of all, the conductive film laminate of Comparative Example 6 was used to measure the service life under the above-described conditions. The time X that had elapsed before the resistance value between the conductive films reached $1 \times 10^5 \Omega$ was measured.

Next, the conductive film laminates of Examples 16 to 26 or Comparative Examples 6 to 10 were used to measure the service life under the above-described conditions. The time Y that had elapsed before the resistance value between the silver interconnects reached $1 \times 10^5 \Omega$ was measured.

The resulting time X and time Y were used to calculate the service life-improving effect (Y/X). All the results are shown in Table 2.

TABLE 2

| | Silver nanowire dispersion | Transparent double-sided adhesive sheet | Adhesive | Compound | Presence of tertiary or quaternary carbon atom | Conc. of compound added | Service life-prolonging effect |
|---|---|---|---|---|---|---|---|
| Example 16 | (1) | Transparent double-sided adhesive sheet A | Acrylic copolymer | A-1 | No | 1.0% | 1.9 |
| Example 17 | (1) | Transparent double-sided adhesive sheet B | Acrylic copolymer | A-2 | No | 1.0% | 1.7 |

TABLE 2-continued

| | Silver nanowire dispersion | Transparent double-sided adhesive sheet | Adhesive | Compound | Presence of tertiary or quaternary carbon atom | Conc. of compound added | Service life-prolonging effect |
|---|---|---|---|---|---|---|---|
| Example 18 | (1) | Transparent double-sided adhesive sheet C | Acrylic copolymer | A-3 | Yes | 1.0% | 1.7 |
| Example 19 | (1) | Transparent double-sided adhesive sheet D | Acrylic copolymer | A-5 | Yes | 1.0% | 2.5 |
| Example 20 | (1) | Transparent double-sided adhesive sheet E | Acrylic copolymer | A-8 | Yes | 2.0% | 2.8 |
| Example 21 | (1) | Transparent double-sided adhesive sheet F | Acrylic copolymer | A-9 | No | 1.0% | 1.9 |
| Example 22 | (1) | Transparent double-sided adhesive sheet G | Acrylic copolymer | A-13 | Yes | 1.0% | 2.1 |
| Example 23 | (1) | Transparent double-sided adhesive sheet H | Acrylic copolymer | A-14 | No | 1.0% | 2.1 |
| Comparative Example 6 | (1) | Transparent double-sided adhesive sheet I | Acrylic copolymer | None | — | — | 1.0 |
| Comparative Example 7 | (1) | Transparent double-sided adhesive sheet J | Acrylic copolymer | R-1 | No | 1.0% | 0.9 |
| Comparative Example 8 | (1) | Transparent double-sided adhesive sheet K | Acrylic copolymer | R-2 | No | 1.0% | NoData (Peeling) |
| Comparative Example 9 | (1) | Transparent double-sided adhesive sheet L | Acrylic copolymer | R-3 | No | 1.0% | NoData (Peeling) |
| Comparative Example 10 | (1) | Transparent double-sided adhesive sheet M | Acrylic copolymer | R-4 | No | 1.0% | NoData (peeling) |
| Example 24 | (1) | Transparent double-sided adhesive sheet N | Acrylic copolymer | A-1 | No | 0.4% | 1.5 |
| Example 25 | (1) | Transparent double-sided adhesive sheet P | Acrylic copolymer | A-1 | No | 2.5% | 2.3 |
| Example 26 | (1) | Transparent double-sided adhesive sheet Q | Acrylic copolymer | A-1 | No | 5.0% | 2.8 |

"NoData (peeling)" in Table 2 indicates that the transparent double-sided adhesive sheet came off during the test and, accordingly, evaluation was not possible. "Conc. of compound added" refers to a weight percentage with respect to the weight of the whole of the transparent double-sided adhesive sheet.

As shown in Table 2, the conductive film laminate of the invention shows a significant service life-prolonging effect, which confirmed that ion migration was further suppressed. An excellent service life-prolonging effect was confirmed without deteriorating the transparency of the transparent double-sided adhesive sheet. More excellent service life-prolonging effect was confirmed particularly when the concentration of compound added was from 0.5 to 5.0 wt %.

From the comparisons between Example 16 and Examples 19 and 20 and the comparisons between Examples 17 and 21, and Example 22, more excellent service life-prolonging effect was confirmed in Examples 19, 20 and 22 in which the hydrocarbon groups are ones containing a tertiary and/or quaternary carbon atom. Even more excellent service life-prolonging effect was confirmed particularly in Example 20 in which the hydrocarbon group is a group containing a plurality of tertiary and/or quaternary carbon atoms.

From the comparisons between Examples 17 and 21, and Example 23, more excellent service life-prolonging effect was confirmed in Example 23 in which the hydrocarbon group is one containing a group represented by formula (B-1) shown above.

On the other hand, a desired effect could not be obtained in Comparative Examples 6 to 10 which used the compositions containing no predetermined compounds.

Particularly in Comparative Examples 8 to 10, the adhesive force is considered to have been reduced by incorporating the compound in the transparent double-sided adhesive sheet.

Example 27

A conductive film laminate was fabricated according to the same procedure as in Example 16 except that the silver nanowire dispersion (1) used for the preparation of the conductive film in Example 16 was replaced by the silver nanowire dispersion (2).

Example 28

A conductive film laminate was fabricated according to the same procedure as in Example 17 except that the silver nanowire dispersion (1) used for the preparation of the conductive film in Example 17 was replaced by the silver nanowire dispersion (2).

Example 29

A conductive film laminate was fabricated according to the same procedure as in Example 18 except that the silver nanowire dispersion (1) used for the preparation of the conductive film in Example 18 was replaced by the silver nanowire dispersion (2).

Example 30

A conductive film laminate was fabricated according to the same procedure as in Example 19 except that the silver nanowire dispersion (1) used for the preparation of the conductive film in Example 19 was replaced by the silver nanowire dispersion (2).

Example 31

A conductive film laminate was fabricated according to the same procedure as in Example 20 except that the silver nanowire dispersion (1) used for the preparation of the conductive film in Example 20 was replaced by the silver nanowire dispersion (2).

Example 32

A conductive film laminate was fabricated according to the same procedure as in Example 21 except that the silver nanowire dispersion (1) used for the preparation of the conductive film in Example 21 was replaced by the silver nanowire dispersion (2).

Example 33

A conductive film laminate was fabricated according to the same procedure as in Example 22 except that the silver nanowire dispersion (1) used for the preparation of the conductive film in Example 22 was replaced by the silver nanowire dispersion (2).

Comparative Example 11

A conductive film laminate was fabricated according to the same procedure as in Comparative Example 6 except that the silver nanowire dispersion (1) used for the preparation of the conductive film in Comparative Example 6 was replaced by the silver nanowire dispersion (2).

Comparative Example 12

A conductive film laminate was fabricated according to the same procedure as in Comparative Example 7 except that the silver nanowire dispersion (1) used for the preparation of the conductive film in Comparative Example 7 was replaced by the silver nanowire dispersion (2).

Comparative Example 13

A conductive film laminate was fabricated according to the same procedure as in Comparative Example 8 except that the silver nanowire dispersion (1) used for the preparation of the conductive film in Comparative Example 8 was replaced by the silver nanowire dispersion (2).

Comparative Example 14

A conductive film laminate was fabricated according to the same procedure as in Comparative Example 9 except that the silver nanowire dispersion (1) used for the preparation of the conductive film in Comparative Example 9 was replaced by the silver nanowire dispersion (2).

Comparative Example 15

A conductive film laminate was fabricated according to the same procedure as in Comparative Example 10 except that the silver nanowire dispersion (1) used for the preparation of the conductive film in Comparative Example 10 was replaced by the silver nanowire dispersion (2).

(Evaluation Method (Measurement of Service Life-Prolonging Effect))

The resulting conductive film laminates were used to measure the service life (device used: EHS-221MD manufactured by ESPEC CORP.) under the following conditions: humidity: 90%; temperature: 60° C.; voltage: 10 V.

In the evaluation method, first of all, the conductive film laminate of Comparative Example 11 was used to measure the service life under the above-described conditions. The time X that had elapsed before the resistance value between the conductive films reached $1 \times 10^5 \Omega$ was measured.

Next, the conductive film laminates of Examples 27 to 33 or Comparative Examples 11 to 15 were used to measure the service life under the above-described conditions. The time Y that had elapsed before the resistance value between the silver interconnects reached $1 \times 10^5 \Omega$ was measured.

The resulting time X and time Y were used to calculate the service life-improving effect (Y/X). All the results are shown in Table 3.

TABLE 3

| | Silver nanowire dispersion | Transparent double-sided adhesive sheet | Adhesive | Compound | Presence of tertiary or quaternary carbon atom | Conc. of compound added | Service life-prolonging effect |
|---|---|---|---|---|---|---|---|
| Example 27 | (2) | Transparent double-sided adhesive sheet A | Acrylic copolymer | A-1 | No | 1.0% | 2.2 |
| Example 28 | (2) | Transparent double-sided adhesive sheet B | Acrylic copolymer | A-2 | No | 1.0% | 2.0 |
| Example 29 | (2) | Transparent double-sided adhesive sheet C | Acrylic copolymer | A-3 | Yes | 1.0% | 1.8 |

TABLE 3-continued

| | Silver nanowire dispersion | Transparent double-sided adhesive sheet | Adhesive | Compound | Presence of tertiary or quaternary carbon atom | Conc. of compound added | Service life-prolonging effect |
|---|---|---|---|---|---|---|---|
| Example 30 | (2) | Transparent double-sided adhesive sheet D | Acrylic copolymer | A-5 | Yes | 1.0% | 2.3 |
| Example 31 | (2) | Transparent double-sided adhesive sheet E | Acrylic copolymer | A-8 | Yes | 2.0% | 2.8 |
| Example 32 | (2) | Transparent double-sided adhesive sheet F | Acrylic copolymer | A-9 | No | 1.0% | 2.2 |
| Example 33 | (2) | Transparent double-sided adhesive sheet G | Acrylic copolymer | A-13 | Yes | 1.0% | 2.4 |
| Comparative Example 11 | (2) | Transparent double-sided adhesive sheet I | Acrylic copolymer | None | — | — | 1.0 |
| Comparative Example 12 | (2) | Transparent double-sided adhesive sheet J | Acrylic copolymer | R-1 | No | 1.0% | 0.9 |
| Comparative Example 13 | (2) | Transparent double-sided adhesive sheet K | Acrylic copolymer | R-2 | No | 1.0% | NoData (Peeling) |
| Comparative Example 14 | (2) | Transparent double-sided adhesive sheet L | Acrylic copolymer | R-3 | No | 1.0% | NoData (Peeling) |
| Comparative Example 15 | (2) | Transparent double-sided adhesive sheet M | Acrylic copolymer | R-4 | No | 1.0% | NoData (Peeling) |

"NoData (peeling)" in Table 3 indicates that the transparent double-sided adhesive sheet came off during the test and, accordingly, evaluation was not possible. "Conc. of compound added" refers to a weight percentage with respect to the weight of the whole of the transparent double-sided adhesive sheet.

Examples 27 to 33 and Comparative Examples 11 to 15 showed that similar effects were achieved even though use was made of the silver nanowire dispersion which was different from that used in Examples 16 to 22 in average short axis diameter of silver nanowires.

Example 34

The method described in Example 16 was used to form conductive films on both surfaces of a transparent substrate. Then, a PET film with a thickness of 50 μm was attached to each of the surfaces of the transparent substrate via a transparent double-sided adhesive sheet A to prepare a capacitive touch panel described in FIG. 6.

Comparative Example 16

A touch panel was fabricated according to the same procedure as in Example 34 except that the transparent double-sided adhesive sheet A in Example 34 was replaced by a transparent double-sided adhesive sheet I.

Comparative Example 17

A touch panel was fabricated according to the same procedure as in Example 34 except that the transparent double-sided adhesive sheet A in Example 34 was replaced by a transparent double-sided adhesive sheet M.

(Test Method)

The resulting touch panels were driven at a humidity of 90% and a temperature of 60° C. for 240 hours, were then returned to a room temperature environment (humidity: 40%; temperature: 25° C.) and were checked for normal operation.

The touch panel obtained in Example 34 operated normally but the touch panels obtained in Comparative Examples 16 and 17 did not operate. This is presumably because ion migration proceeded between the patterned conductive films in Comparative Examples 16 and 17.

What is claimed is:

1. A composition for forming a silver ion diffusion-suppressing layer, comprising:
    an insulating resin; and
    a compound including: a structure selected from the group consisting of a triazole structure, a thiadiazole structure and a benzimidazole structure; a mercapto group; and at least one hydrocarbon group optionally containing a heteroatom, with a total number of carbon atoms in the at least one hydrocarbon group being 5 or more,
    wherein the compound is a compound represented by one of formulae (1) to (3):

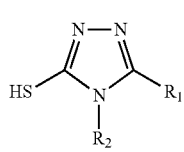

Formula (1)

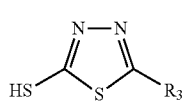

Formula (2)

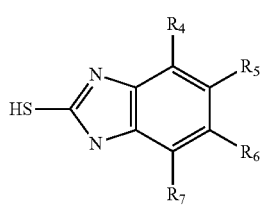

Formula (3)

[in formula (1), $R_1$ and $R_2$ each independently represent a hydrogen atom or a hydrocarbon group optionally containing a heteroatom; at least one of $R_1$ and $R_2$ represents the hydrocarbon group; and a total number of carbon atoms contained in groups $R_1$ and $R_2$ is 5 or more, where at least one of $R_1$ and $R_2$ represents an aliphatic hydrocarbon group optionally containing a heteroatom;

in formula (2), $R_3$ represents a hydrocarbon group optionally containing a heteroatom and a number of carbon atoms contained in $R_3$ is 5 or more, where $R_3$ represents an aliphatic hydrocarbon group optionally containing a heteroatom; and in formula (3), $R_4$ to $R_7$ each independently represent a hydrogen atom, a halogen atom or a hydrocarbon group optionally containing a heteroatom; at least one of $R_4$ to $R_7$ represents the hydrocarbon group; and a total number of carbon atoms contained in groups $R_4$ to $R_7$ is 5 or more, where at least one of $R_4$ to $R_7$ represents an aliphatic hydrocarbon group optionally containing a heteroatom].

2. The composition for forming a silver ion diffusion-suppressing layer according to claim 1, wherein the at least one hydrocarbon group is a hydrocarbon group containing a tertiary carbon atom and/or a quaternary carbon atom.

3. The composition for forming a silver ion diffusion-suppressing layer according to claim 1, wherein the at least one hydrocarbon group is a hydrocarbon group which contains at least one type of group represented by one formula selected from the group consisting of formulae (B-1) to (B-7):

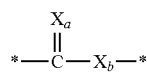

Formula (B-1)

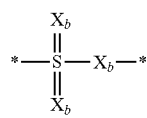

Formula (B-2)

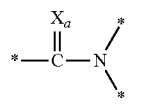

Formula (B-3)

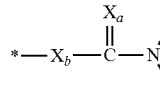

Formula (B-4)

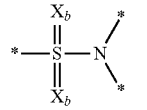

Formula (B-5)

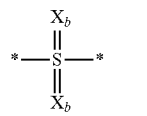

Formula (B-6)

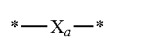

Formula (B-7)

[in formulae (B-1) to (B-7), groups $X_a$ are each an atom selected from the group consisting of oxygen atom, sulfur atom, selenium atom and tellurium atom; the groups $X_a$ may be identical to or different from each other; groups $X_b$ are each an oxygen atom or a sulfur atom; the groups $X_b$ may be identical to or different from each other; and asterisks represent binding positions] and which is optionally bonded directly to the structure selected from the group consisting of the triazole structure, the thiadiazole structure and the benzimidazole structure at one of the asterisks in formulae (B-1) to (B-7).

4. The composition for forming a silver ion diffusion-suppressing layer according to claim 1, wherein the at least one hydrocarbon group is a group represented by $—S—R_q$ [where $R_q$ represents a hydrocarbon group containing 1 to 30 carbon atoms which may have —COO— or —CON<].

5. A film for a silver ion diffusion-suppressing layer, comprising:
an insulating resin; and
a compound including: a structure selected from the group consisting of a triazole structure, a thiadiazole structure and a benzimidazole structure; a mercapto group; and at least one hydrocarbon group optionally containing a heteroatom, with a total number of carbon atoms in the at least one hydrocarbon group being 5 or more,
wherein the compound is a compound represented by one of formulae (1) to (3):

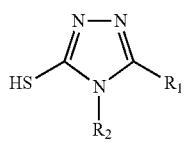

Formula (1)

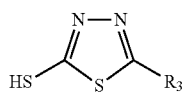

Formula (2)

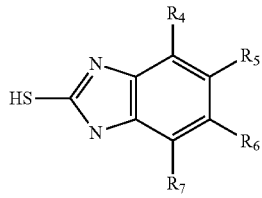

Formula (3)

[in formula (1), $R_1$ and $R_2$ each independently represent a hydrogen atom or a hydrocarbon group optionally containing a heteroatom; at least one of $R_1$ and $R_2$ represents the hydrocarbon group; and a total number of carbon atoms contained in groups $R_1$ and $R_2$ is 5 or more, where at least one of $R_1$ and $R_2$ represents an aliphatic hydrocarbon group optionally containing a heteroatom;

in formula (2), $R_3$ represents a hydrocarbon group optionally containing a heteroatom and a number of carbon atoms contained in $R_3$ is 5 or more, where $R_3$ represents an aliphatic hydrocarbon group optionally containing a heteroatom; and in formula (3), $R_4$ to $R_7$ each independently represent a hydrogen atom, a halogen atom or a hydrocarbon group optionally containing a heteroatom; at least one of $R_4$ to $R_7$ represents the hydrocarbon group; and a total number of carbon atoms contained in groups $R_4$ to $R_7$ is 5 or more, where at least one of $R_4$ to $R_7$ represents an aliphatic hydrocarbon group optionally containing a heteroatom].

6. The film for a silver ion diffusion-suppressing layer according to claim 5, wherein the at least one hydrocarbon group is a hydrocarbon group containing a tertiary carbon atom and/or a quaternary carbon atom.

7. The film for a silver ion diffusion-suppressing layer according to claim 5, wherein the at least one hydrocarbon group is a hydrocarbon group which contains at least one type of group represented by one formula selected from the group consisting of formulae (B-1) to (B-7):

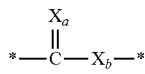

Formula (B-1)

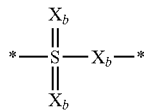

Formula (B-2)

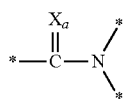

Formula (B-3)

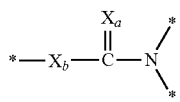

Formula (B-4)

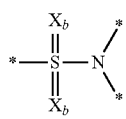

Formula (B-5)

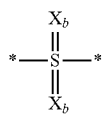

Formula (B-6)

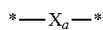

Formula (B-7)

[in formulae (B-1) to (B-7), groups $X_a$ are each an atom selected from the group consisting of oxygen atom, sulfur atom, selenium atom and tellurium atom; the groups $X_a$ may be identical to or different from each other; groups $X_b$ are each an oxygen atom or a sulfur atom; the groups $X_b$ may be identical to or different from each other; and asterisks represent binding positions] and which is optionally bonded directly to the structure selected from the group consisting of the triazole structure, the thiadiazole structure and the benzimidazole structure at one of the asterisks in formulae (B-1) to (B-7).

8. The film for a silver ion diffusion-suppressing layer according to claim 5, wherein the at least one hydrocarbon group is a group represented by —S—$R_q$ [where $R_q$ represents a hydrocarbon group containing 1 to 30 carbon atoms which may have —COO— or —CON<].

9. A circuit board comprising: an insulating substrate; metal interconnects disposed on the insulating substrate and containing silver or a silver alloy; and a silver ion diffusion-suppressing layer disposed on the metal interconnects,
wherein the silver ion diffusion-suppressing layer comprises an insulating resin and a compound including: a structure selected from the group consisting of a triazole structure, a thiadiazole structure and a benzimidazole structure; a mercapto group; and at least one hydrocarbon group bonded to the structure and optionally containing a heteroatom, with a total number of carbon atoms in the at least one hydrocarbon group being 5 or more,
wherein the compound is a compound represented by one of formulae (1) to (3):

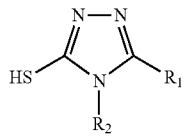

Formula (1)

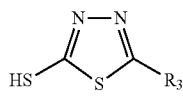

Formula (2)

Formula (3)

[in formula (1), $R_1$ and $R_2$ each independently represent a hydrogen atom or a hydrocarbon group optionally containing a heteroatom; at least one of $R_1$ and $R_2$ represents the hydrocarbon group; and a total number of carbon atoms contained in groups $R_1$ and $R_2$ is 5 or more, where at least one of $R_1$ and $R_2$ represents an aliphatic hydrocarbon group optionally containing a heteroatom;

in formula (2), $R_3$ represents a hydrocarbon group optionally containing a heteroatom and a number of carbon atoms contained in $R_3$ is 5 or more, where $R_3$ represents an aliphatic hydrocarbon group optionally containing a heteroatom; and in formula (3), $R_4$ to $R_7$ each independently represent a hydrogen atom, a halogen atom or a hydrocarbon group optionally containing a heteroatom; at least one of $R_4$ to $R_7$ represents the hydrocarbon group; and a total number of carbon atoms contained in groups $R_4$ to $R_7$ is 5 or more, where at least one of $R_4$ to $R_7$ represents an aliphatic hydrocarbon group optionally containing a heteroatom].

10. The circuit board according to claim 9, wherein the at least one hydrocarbon group is a hydrocarbon group containing a tertiary carbon atom and/or a quaternary carbon atom.

11. The circuit board according to claim 9, wherein the at least one hydrocarbon group is a hydrocarbon group which contains at least one type of group represented by one formula selected from the group consisting of formulae (B-1) to (B-7):

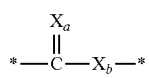

Formula (B-1)

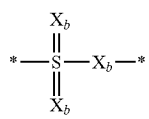

Formula (B-2)

-continued

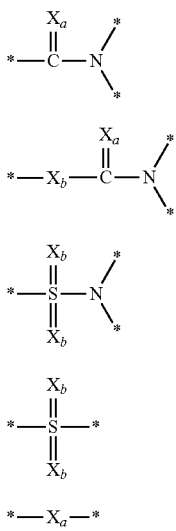

Formula (B-3)

Formula (B-4)

Formula (B-5)

Formula (B-6)

Formula (B-7)

[in formulae (B-1) to (B-7), groups $X_a$ are each an atom selected from the group consisting of oxygen atom, sulfur atom, selenium atom and tellurium atom; the groups $X_a$ may be identical to or different from each other; groups $X_b$ are each an oxygen atom or a sulfur atom; the groups $X_b$ may be identical to or different from each other; and asterisks represent binding positions] and which is optionally bonded directly to the structure selected from the group consisting of the triazole structure, the thiadiazole structure and the benzimidazole structure at one of the asterisks in formulae (B-1) to (B-7).

12. The circuit board according to claim 9, wherein the at least one hydrocarbon group is a group represented by —S—$R_q$ [where $R_q$ represents a hydrocarbon group containing 1 to 30 carbon atoms which may have —COO— or —CON<].

13. An electronic device comprising the circuit board according to claim 9.

14. A conductive film laminate comprising: a transparent substrate; a conductive film disposed on the transparent substrate and containing silver or a silver alloy; and a transparent double-sided adhesive sheet attached onto the conductive film, wherein the transparent double-sided adhesive sheet comprises a compound including: a structure selected from the group consisting of a triazole structure, a thiadiazole structure and a benzimidazole structure; a mercapto group; and at least one hydrocarbon group optionally containing a heteroatom, with a total number of carbon atoms in the at least one hydrocarbon group being 5 or more, wherein the compound is a compound represented by one of formulae (1) to (3):

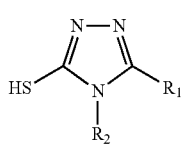

Formula (1)

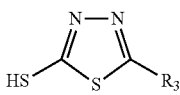

Formula (2)

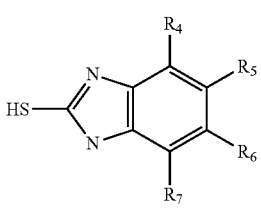

Formula (3)

[in formula (1), $R_1$ and $R_2$ each independently represent a hydrogen atom or a hydrocarbon group optionally containing a heteroatom; at least one of $R_1$ and $R_2$ represents the hydrocarbon group; and a total number of carbon atoms contained in groups $R_1$ and $R_2$ is 5 or more, where at least one of $R_1$ and $R_2$ represents an aliphatic hydrocarbon group optionally containing a heteroatom;

in formula (2), $R_3$ represents a hydrocarbon group optionally containing a heteroatom and a number of carbon atoms contained in $R_3$ is 5 or more, where $R_3$ represents an aliphatic hydrocarbon group optionally containing a heteroatom; and in formula (3), $R_4$ to $R_7$ each independently represent a hydrogen atom, a halogen atom or a hydrocarbon group optionally containing a heteroatom; at least one of $R_4$ to $R_7$ represents the hydrocarbon group; and a total number of carbon atoms contained in groups $R_4$ to $R_7$ is 5 or more, where at least one of $R_4$ to $R_7$ represents an aliphatic hydrocarbon group optionally containing a heteroatom].

15. The conductive film laminate according to claim 14, wherein the at least one hydrocarbon group is a hydrocarbon group containing a tertiary carbon atom and/or a quaternary carbon atom.

16. The conductive film laminate according to claim 14, wherein the at least one hydrocarbon group is a hydrocarbon group which contains at least one type of group represented by one formula selected from the group consisting of formulae (B-1) to (B-7):

Formula (B-1)

Formula (B-2)

Formula (B-3)

Formula (B-4)

-continued

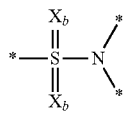
Formula (B-5)

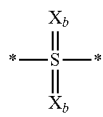
Formula (B-6)

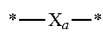
Formula (B-7)

[in formulae (B-1) to (B-7), groups $X_a$ are each an atom selected from the group consisting of oxygen atom, sulfur atom, selenium atom and tellurium atom; the groups $X_a$ may be identical to or different from each other; groups $X_b$ are each an oxygen atom or a sulfur atom; the groups $X_b$ may be identical to or different from each other; and asterisks represent binding positions] and which is optionally bonded directly to the structure selected from the group consisting of the triazole structure, the thiadiazole structure and the benzimidazole structure at one of the asterisks in formulae (B-1) to (B-7).

17. The conductive film laminate according to claim 14, wherein the at least one hydrocarbon group is a group represented by —S—$R_q$ [where $R_q$ represents a hydrocarbon group containing 1 to 30 carbon atoms which may have —COO— or —CON<].

18. The conductive film laminate according to claim 14, wherein the conductive film includes metal nanowires composed of silver or a silver alloy.

19. The conductive film laminate according to claim 14, wherein the transparent double-sided adhesive sheet contains an acrylic adhesive.

20. A touch panel comprising the conductive film laminate according to claim 14.

21. A transparent double-sided adhesive sheet comprising:
    an acrylic adhesive; and
    a compound including: a structure selected from the group consisting of a triazole structure, a thiadiazole structure and a benzimidazole structure; a mercapto group; and at least one hydrocarbon group optionally containing a heteroatom, with a total number of carbon atoms in the at least one hydrocarbon group being 5 or more,
    wherein the compound is a compound represented by one of formulae (1) to (3):

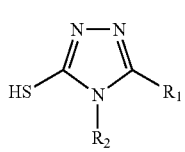
Formula (1)

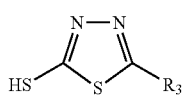
Formula (2)

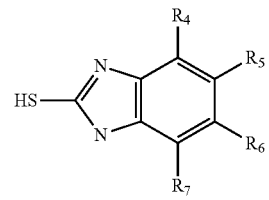
Formula (3)

[in formula (1), $R_1$ and $R_2$ each independently represent a hydrogen atom or a hydrocarbon group optionally containing a heteroatom; at least one of $R_1$ and $R_2$ represents the hydrocarbon group; and a total number of carbon atoms contained in groups $R_1$ and $R_2$ is 5 or more, where at least one of $R_1$ and $R_2$ represents an aliphatic hydrocarbon group optionally containing a heteroatom;

in formula (2), $R_3$ represents a hydrocarbon group optionally containing a heteroatom and a number of carbon atoms contained in $R_3$ is 5 or more, where $R_3$ represents an aliphatic hydrocarbon group optionally containing a heteroatom; and in formula (3), $R_4$ to $R_7$ each independently represent a hydrogen atom, a halogen atom or a hydrocarbon group optionally containing a heteroatom; at least one of $R_4$ to $R_7$ represents the hydrocarbon group; and a total number of carbon atoms contained in groups $R_4$ to $R_7$ is 5 or more, where at least one of $R_4$ to $R_7$ represents an aliphatic hydrocarbon group optionally containing a heteroatom].

22. The transparent double-sided adhesive sheet according to claim 21, wherein the at least one hydrocarbon group is a hydrocarbon group containing a tertiary carbon atom and/or a quaternary carbon atom.

23. The transparent double-sided adhesive sheet according to claim 21, wherein the at least one hydrocarbon group is a hydrocarbon group which contains at least one type of group represented by one formula selected from the group consisting of formulae (B-1) to (B-7):

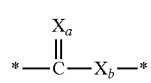
Formula (B-1)

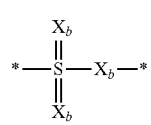
Formula (B-2)

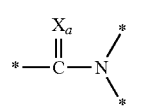
Formula (B-3)

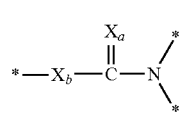
Formula (B-4)

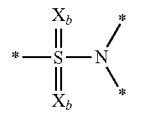
Formula (B-5)

-continued

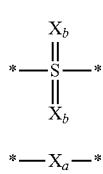

Formula (B-6)

Formula (B-7)

*—$X_a$—*

[in formulae (B-1) to (B-7), groups $X_a$ are each an atom selected from the group consisting of oxygen atom, sulfur atom, selenium atom and tellurium atom; the groups $X_a$ may be identical to or different from each other; groups $X_b$ are each an oxygen atom or a sulfur atom; the groups $X_b$ may be identical to or different from each other; and asterisks represent binding positions] and which is optionally bonded directly to the structure selected from the group consisting of the triazole structure, the thiadiazole structure and the benzimidazole structure at one of the asterisks in formulae (B-1) to (B-7).

24. The transparent double-sided adhesive sheet according to claim 21, wherein the at least one hydrocarbon group is a group represented by —S—$R_q$ [where $R_q$ represents a hydrocarbon group containing 1 to 30 carbon atoms which may have —COO— or —CON<].

* * * * *